(12) United States Patent
Kim et al.

(10) Patent No.: US 8,593,865 B2
(45) Date of Patent: Nov. 26, 2013

(54) NONVOLATILE MEMORY DEVICE HAVING STACKED TRANSISTOR CONFIGURATION

(75) Inventors: Su-yong Kim, Yongin-si (KR); Doogon Kim, Hwaseong-si (KR)

(73) Assignee: Samsung Electronics Co., Ltd., Suwon-si. Gyeonggi-do (KR)

(*) Notice: Subject to any disclaimer, the term of this patent is extended or adjusted under 35 U.S.C. 154(b) by 27 days.

(21) Appl. No.: 13/236,746

(22) Filed: Sep. 20, 2011

(65) Prior Publication Data

US 2012/0140586 A1    Jun. 7, 2012

(30) Foreign Application Priority Data

Dec. 6, 2010 (KR) .................. 10-2010-0123794

(51) Int. Cl.
*G11C 16/04* (2006.01)
*G11C 16/08* (2006.01)

(52) U.S. Cl.
CPC ..................................... *G11C 16/08* (2013.01)
USPC ............ 365/185.11; 365/185.13; 365/230.03; 365/230.01; 365/230.06; 365/185.16

(58) Field of Classification Search
CPC ....................................................... G11C 16/08
USPC ............. 365/185.11, 185.13, 230.03, 230.01, 365/230.06
See application file for complete search history.

(56) References Cited

U.S. PATENT DOCUMENTS

| 7,646,664 B2 | 1/2010 | Cho et al. |
| 2009/0185422 A1 | 7/2009 | Kang et al. |
| 2009/0268522 A1 | 10/2009 | Maejima |
| 2010/0213526 A1* | 8/2010 | Wada et al. ................... 257/314 |

FOREIGN PATENT DOCUMENTS

| JP | 2009-266944 | 11/2009 |
| KR | 1020080033051 A | 4/2008 |
| KR | 1020090080337 | 7/2009 |
| KR | 1020090112553 A | 10/2009 |

* cited by examiner

*Primary Examiner* — Thong Q Le
(74) *Attorney, Agent, or Firm* — Volentine & Whitt, PLLC

(57) ABSTRACT

A nonvolatile memory device comprises a memory cell array comprising a plurality of memory blocks, an address decoder that selects one of the memory blocks in response to an input address and generates a first control signal and a second control signal, a plurality of metal lines connected with the memory blocks and extending along a first direction, a plurality of pass transistors that connect the address decoder with a first subset of the metal lines connected with the selected memory block in response to the first control signal, and a plurality of ground transistors that supply a low voltage to a second subset of the metal lines connected with unselected memory blocks in response to the second control signal. The ground transistors have channels that extend along a second direction perpendicular to the first direction.

19 Claims, 19 Drawing Sheets

US 8,593,865 B2

NONVOLATILE MEMORY DEVICE HAVING STACKED TRANSISTOR CONFIGURATION

CROSS-REFERENCE TO RELATED APPLICATIONS

This application claims priority under 35 U.S.C §119 to Korean Patent Application No. 10-2010-0123794 filed on Dec. 6, 2010, the disclosure of which is hereby incorporated by reference in its entirety.

BACKGROUND OF THE INVENTION

Embodiments of the inventive concept relate generally to electronic memory technologies. More particularly, embodiments of the inventive concept relate to nonvolatile memory devices and related transistor configurations.

Semiconductor memory devices are fabricated using semiconductor materials such as silicon (Si), germanium (Ge), gallium arsenide (GaAs), and indium phosphide (InP). Semiconductor memory devices can be roughly divided into two categories according to whether they retain stored data when disconnected from power. These categories include volatile memory devices, which lose stored data when disconnected from power, and nonvolatile memory devices, which retain stored data when disconnected from power. Examples of volatile memory devices include static RAM (SRAM), dynamic RAM (DRAM), and synchronous DRAM (SDRAM), and examples of nonvolatile memory devices include read only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM), and a ferroelectric RAM (FRAM).

In an effort to improve the integration density of nonvolatile memory devices, researchers have recently developed nonvolatile memory devices in which memory cells are arranged in a three-dimensional array. One challenge in developing these devices is to ensure their structural integrity. For example, where features are stacked on top of each other in a three-dimensional array, some of the features may be formed on air gaps or spaces, which can weaken their structure.

SUMMARY OF THE INVENTION

According to one embodiment of the inventive concept, a nonvolatile memory device comprises a memory cell array comprising a plurality of memory blocks, an address decoder configured to select one of the memory blocks in response to an input address and to generate a first control signal and a second control signal, a plurality of metal lines connected with the memory blocks and extending along a first direction, a plurality of pass transistors configured to connect the address decoder with a first subset of the metal lines connected with the selected memory block in response to the first control signal, and a plurality of ground transistors configured to supply a low voltage to a second subset of the metal lines connected with unselected memory blocks in response to the second control signal. The ground transistors have channels that extend along a second direction perpendicular to the first direction.

According to another embodiment of the inventive concept, a nonvolatile memory device comprises a memory cell array comprising a plurality of memory blocks, an address decoder configured to select one of the plurality of memory blocks in response to an input address and to generate a first control signal and a second control signal, a plurality of first metal lines connected with a plurality of string selection transistors corresponding to the plurality of memory blocks and extending along a first direction, a plurality of second metal lines connected with a plurality of memory cell transistors of each of the plurality of memory blocks, a plurality of pass transistors configured to connect the address decoder with a subset of the first and second metal lines corresponding to the selected memory block in response to the first control signal, and a plurality of ground transistors configured to connect a low voltage node with a subset of the first metal lines connected to unselected memory blocks. The ground transistors have channels that extend along a second direction perpendicular to the first direction.

According to another embodiment of the inventive concept, a nonvolatile memory device comprises a memory cell array comprising a plurality of memory blocks, a plurality of metal lines connected with the memory blocks and extending along a first direction, a plurality of pass transistors configured to supply a first voltage to a first subset of the metal lines connected with a selected memory block in response to a first control signal, and a plurality of ground transistors configured to supply a second voltage to a second subset of the metal lines connected with unselected memory blocks in response to a second control signal. The ground transistors have channels that extend along a second direction perpendicular to the first direction.

These and other embodiments of the inventive concept can improve the structural integrity of ground transistors in stacked nonvolatile memory devices. This in turn can improve the reliability of the stacked nonvolatile memory devices.

BRIEF DESCRIPTION OF THE DRAWINGS

The drawings illustrate selected embodiments of the inventive concept. In the drawings, like reference numbers indicate like features.

DETAILED DESCRIPTION

Figure 1:
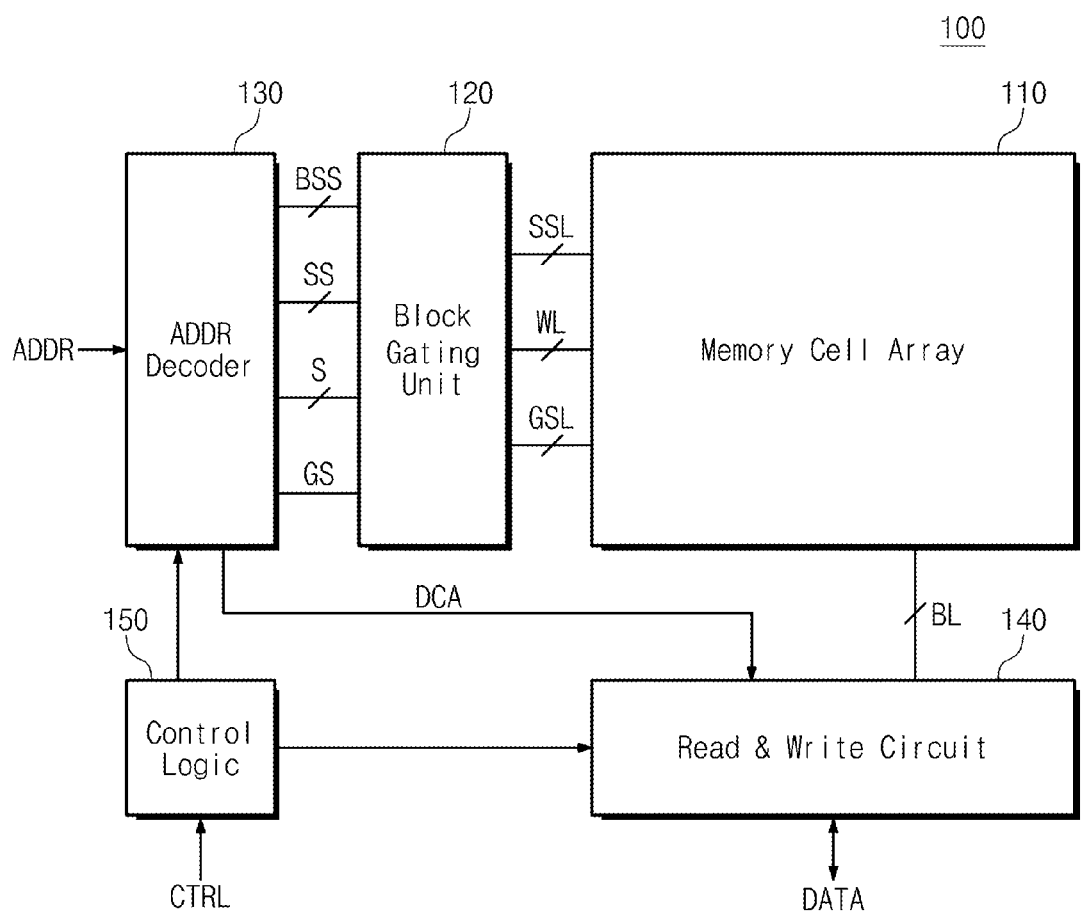
FIG. 1 is a block diagram of a nonvolatile memory device according to an embodiment of the inventive concept.

Embodiments of the inventive concept are described below with reference to the accompanying drawings. These embodiments are presented as teaching examples and should not be construed to limit the scope of the inventive concept.

In the description that follows, the terms first, second, third, etc., are used to describe various features, but these features should not be limited by these terms. Rather, these terms are used merely to distinguish between different features. Accordingly, a first feature discussed below could be termed a second feature without changing the meaning of the described features.

Spatially relative terms, such as "beneath", "below", "lower", "under", "above", "upper", are used herein for ease of description to indicate one feature's relationship to another feature as illustrated in the drawings. These spatially relative terms are intended to encompass different orientations of the described features in use or operation in addition to the orientation depicted in the figures. For example, if a device shown in one of the figures is turned over, features described as "below" or "beneath" or "under" other features would then be oriented "above" the other elements or features. Thus, the terms "below" and "under" can encompass both an orientation of above and below. The device may be otherwise oriented (rotated 90 degrees or at other orientations) and the spatially relative descriptors used herein interpreted accordingly. In addition, where a feature is referred to as being "between" two features, it can be the only feature between the two features, or one or more intervening features may also be present.

The terminology used herein is for the purpose of describing particular embodiments only and is not intended to be limiting of the inventive concept. As used herein, the singular forms "a", "an", and "the" are intended to include the plural forms as well, unless the context clearly indicates otherwise. The terms "comprises" and/or "comprising," when used in this specification, indicate the presence of stated features, but they do not preclude the presence or addition of one or more other features. As used herein, the term "and/or" indicates any and all combinations of one or more of the associated listed items.

Where a feature is referred to as being "on", "connected to", "coupled to", or "adjacent to" another feature, it can be directly on, connected, coupled, or adjacent to the other feature, or intervening features may be present. In contrast, where a feature is referred to as being "directly on," "directly connected to", "directly coupled to", or "immediately adjacent to" another feature, there are no intervening features present.

Unless otherwise defined, all terms (including technical and scientific terms) used herein have the same meaning as commonly understood by one of ordinary skill in the art. Terms such as those defined in commonly used dictionaries should be interpreted as having a meaning that is consistent with their meaning in the context of the relevant art and/or the written description and should not be interpreted in an idealized or overly formal sense unless expressly so defined herein.

FIG. 1 is a block diagram of a nonvolatile memory device 100 according to an embodiment of the inventive concept.

Referring to FIG. 1, nonvolatile memory device 100 comprises a memory cell array 110, a block gating unit 120, an address decoder 130, a read/write circuit 140, and control logic 150.

Memory cell array 110 comprises a plurality of memory blocks each having a plurality of memory cells arranged along row and column directions on a substrate. The memory cells are arranged in cell strings, where each cell string comprises multiple memory cells stacked along a direction perpendicular to the substrate. In other words, the memory cells are arranged on the substrate along rows and columns, and they are stacked along a direction perpendicular to the substrate to form a three-dimensional structure. The memory cells of memory cell array 110 can be configured to store one or more bits of data per memory cell.

Block gating unit 120 is coupled to memory cell array 110 via string selection lines SSL, word lines WL, and ground selection lines GSL. Block gating unit 120 is coupled to address decoder 130 via string lines SS, selection lines S, and ground lines GS.

Block gating unit 120 receives a block selection signal BSS from address decoder 130 and selects a memory block of memory cell array 110 in response to block selection signal BSS. Block gating unit 120 connects string selection lines SSL, word lines WL, and ground selection lines GSL of the selected memory block with string lines SS, selection lines S, and ground lines GS.

Address decoder 130 is coupled with block gating unit 120 via string lines SS, selection lines S, and ground lines GS. Address decoder 130 operates under the control of control logic 150. Address decoder 130 receives an address ADDR from an external device, decodes a row address from address ADDR, and outputs block selection signal BSS based on the decoded row address. Address decoder 130 selects one of selection lines S corresponding to the decoded row address and selects a string line and a ground line corresponding to the decoded row address. The selected string line and the selected ground line are selected from among string lines SS and ground lines GS.

Address decoder 130 decodes a column address of address ADDR to produce a decoded column address DCA, and it transmits decoded column address DCA to read/write circuit 140. Address decoder 130 typically comprises a row decoder configured to decode a row address, a column decoder configured to decode a column address, and an address buffer configured to store address ADDR.

Read/write circuit 140 is connected to memory cell array 110 via bit lines BL. Read/write circuit 140 is configured to exchange data with an external device, and it operates under the control of control logic 150. Read/write circuit 140 receives decoded column address DCA from address decoder 120, and it selects bit lines in response to the decoded column address DCA.

Read/write circuit 140 can perform various types of memory access operations. For example, it can perform a write operation to write data received from an external device in memory cell array 110, perform a read operation to read data from memory cell array 110 and output it to an external device, or perform a copy-back operation to read data from a first storage region of the memory cell array and write it in a second storage region.

Read/write circuit 140 typically comprises features such as a page buffer (or, a page register), a column selector circuit, or a data buffer. Read/write circuit 140 can also comprise other features, such as a sense amplifier, a write driver, a column selector circuit, or a data buffer.

Control logic 150 is coupled with address decoder 130 and read/write circuit 140, and it controls overall operations of nonvolatile memory device 100.

Figure 2:
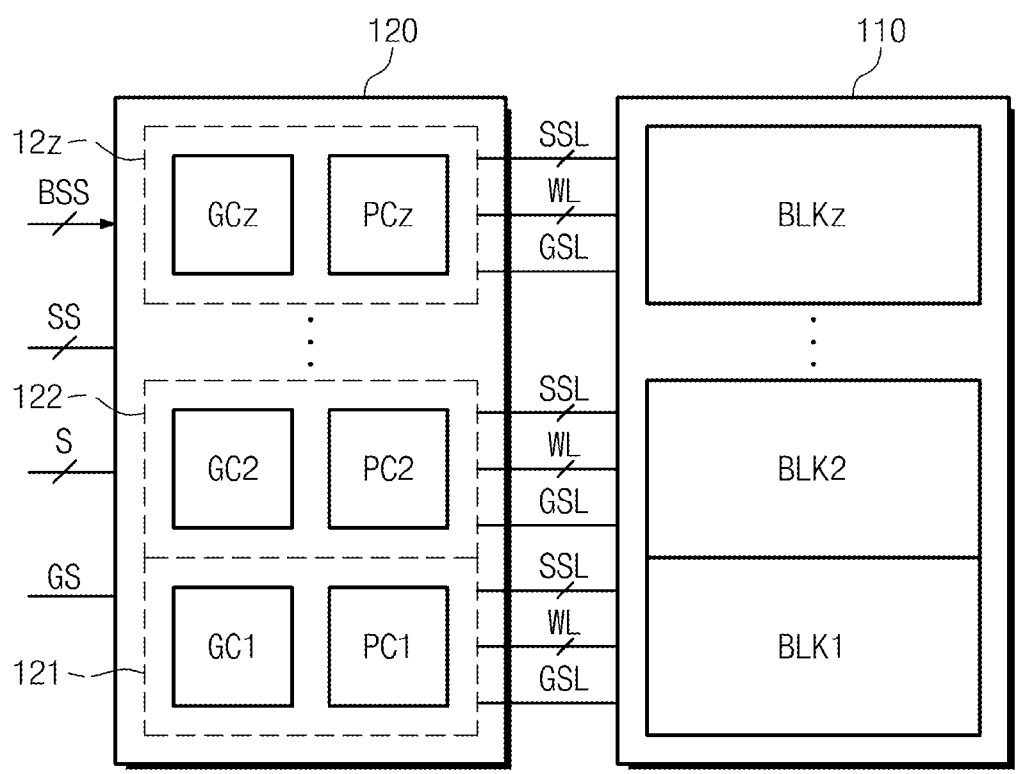
FIG. 2 is a block diagram of a memory cell array and a block gating unit of FIG. 1 according to an embodiment of the inventive concept.

FIG. 2 is a block diagram illustrating memory cell array 110 and block gating unit 120 of FIG. 1 according to an embodiment of the inventive concept.

Referring to FIG. 2, memory cell array 110 comprises a plurality of memory blocks BLK1 through BLKz each connected with block gating unit 120 via one of string selection lines SSL, one of word lines WL, and one of ground selection lines GSL.

Block gating unit 120 comprises a plurality of gating circuits 121 through 12z each corresponding to one of memory blocks BLK1 through BLKz. Each of gating circuits 121 through 12z comprises a ground circuit GCi (i=1 through z) and a pass circuit PCi.

A pass circuit PCi corresponding to the selected memory block responds to block selection signal BSS to connect a selected string selection line SSL, a selected word line WL, and a selected ground selection line GSL with a corresponding string line SS, selection line S, and ground line GS, respectively. A ground circuit GCi supplies a low voltage (e.g., a ground voltage VSS) to string selection lines SSL and ground selection lines of unselected memory blocks.

Figure 3:
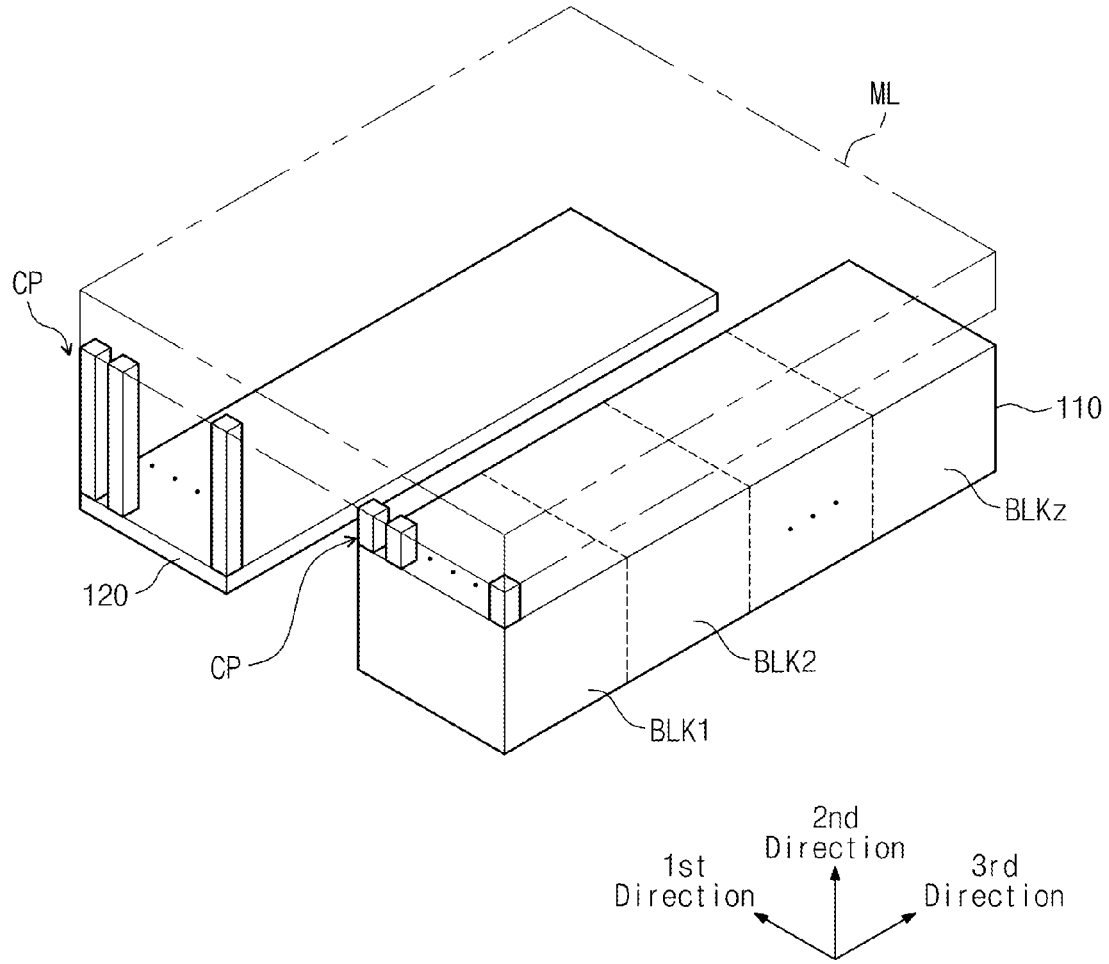
FIG. 3 is a perspective view of the memory cell array and the block gating unit of FIG. 1 according to an embodiment of the inventive concept.

FIG. 3 is a perspective view of memory cell array 110 and block gating unit 120 of FIG. 1 according to an embodiment of the inventive concept.

Referring to FIG. 3, memory cell array 110 has a three-dimensional structure, also referred to as a vertical structure. In this structure memory blocks BLK1 through BLKz are stacked along a second direction and are formed in a plane extending along first and third directions. Block gating unit 120 has a plane structure and is formed in a plane extending in the first and third directions.

Memory cell array 110 and block gating unit 120 are interconnected via a metal layer ML formed over memory cell array 110 and block gating unit 120. Memory cell array 110 is connected with metal layer ML via contact plugs CP, and block gating unit 120 is connected with metal layer ML via contact plugs CP. In various alternative embodiments, the locations of contact plugs CP can be changed from those shown in FIG. 3.

Figure 4:
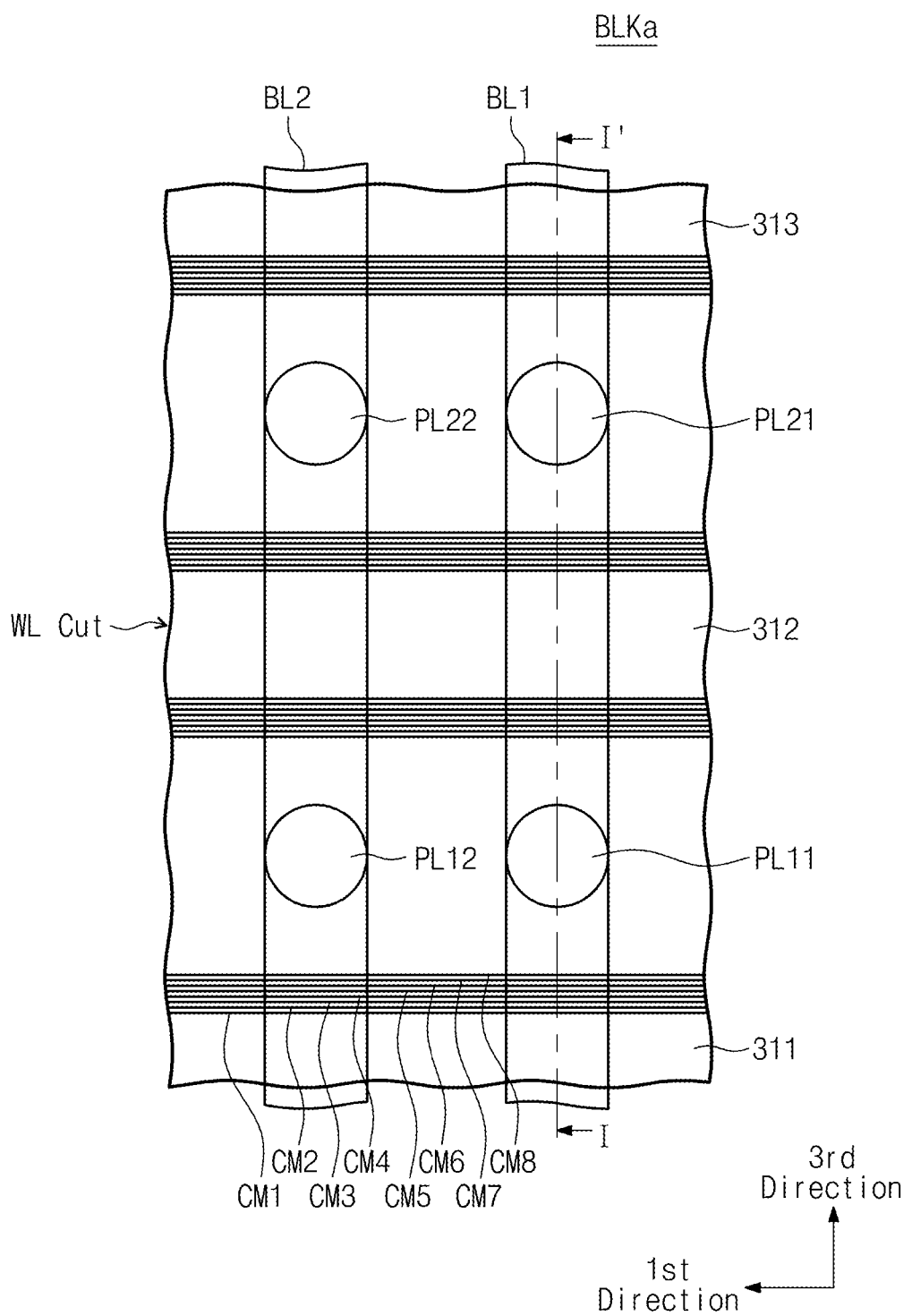
FIG. 4 is a plane view of a memory block shown in FIGS. 2 and 3 according to an embodiment of the inventive concept.
Figure 5:
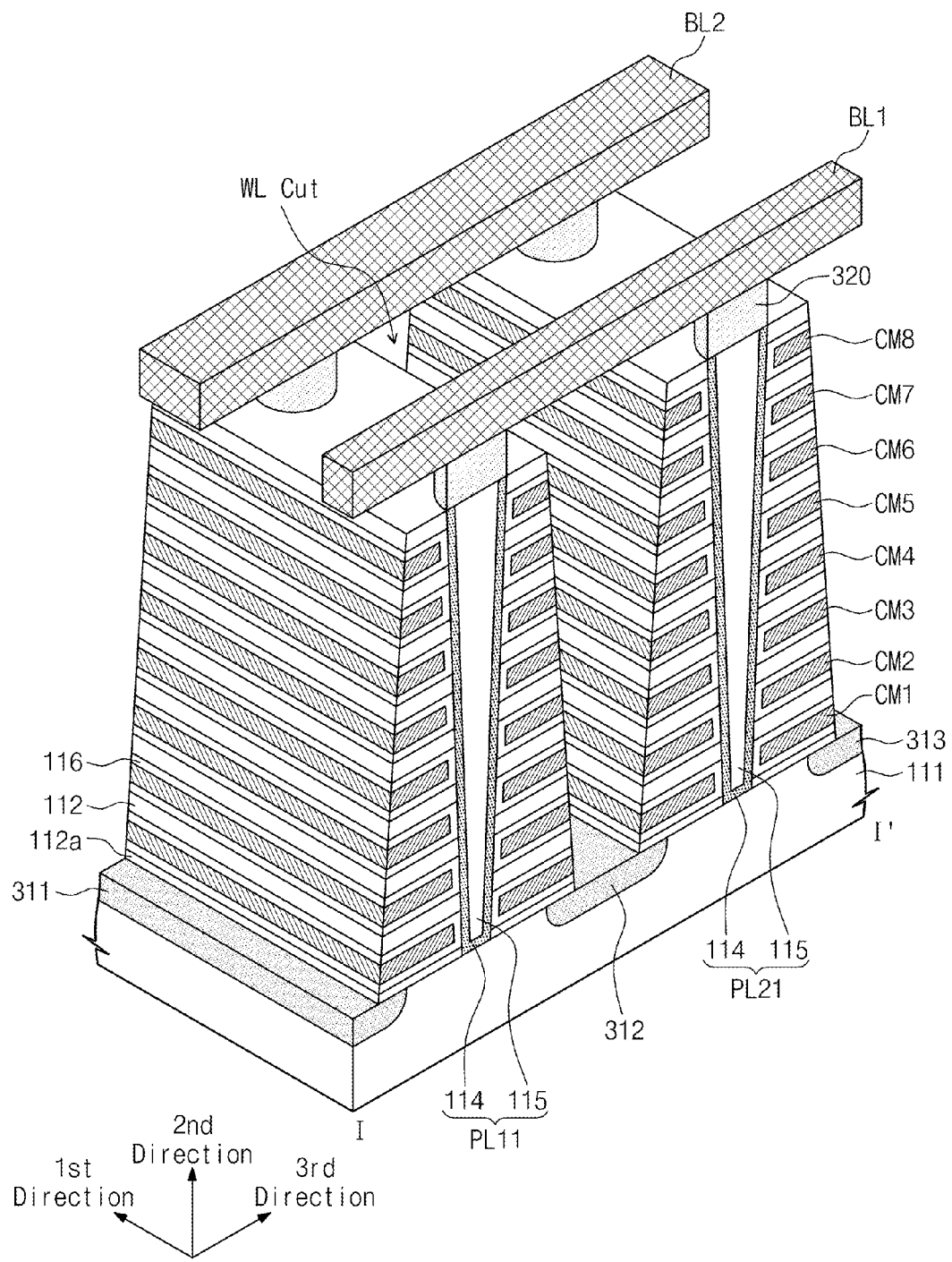
FIG. 5 is a perspective view taken along a line I-I' in FIG. 4 according to an embodiment of the inventive concept.

FIG. 4 is a plane view of one of memory blocks BLK1 through BLKz of FIGS. 2 and 3 according to an embodiment of the inventive concept. In particular, FIG. 4 shows a plane view of conductive layers of a memory block BLKa. FIG. 5 is a perspective view taken along a line I-I' in FIG. 4, and FIG. 6 is a cross-sectional view taken along a line I-I' in FIG. 4.

Figure 6:
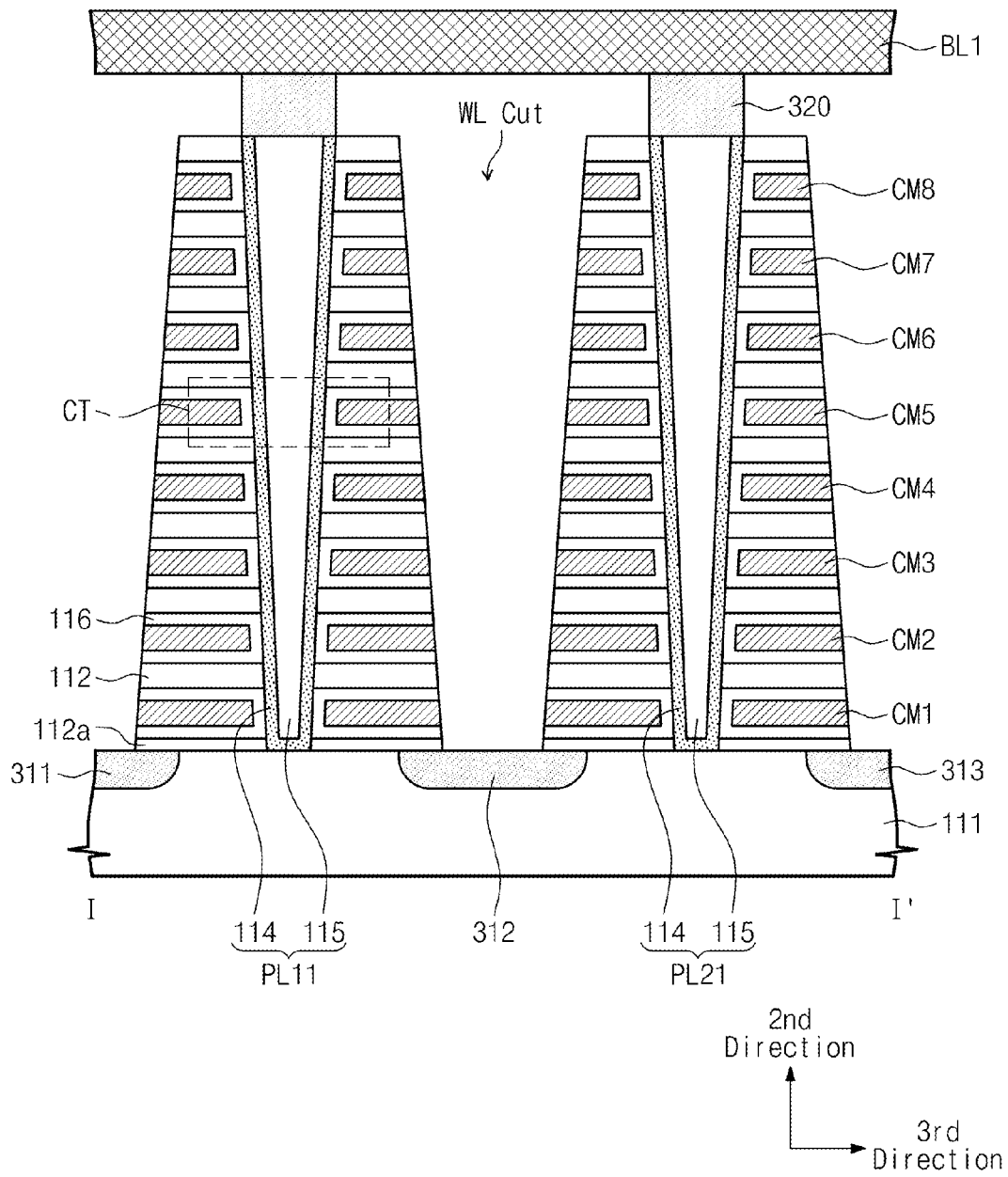
FIG. 6 is a cross-sectional view taken along a line I-I' in FIG. 4 according to an embodiment of the inventive concept.

Referring to FIGS. 4 through 6, memory block BLKa comprises three-dimensional structures extending along the first through third directions and formed on a substrate 111. Substrate 111 forms a well having a first conductivity type, such as a p-well doped with a Group III element such as boron. Substrate 111 can be a pocket p-well provided within an n-well. Below, it is assumed that substrate 111 is a p-well (or, a pocket p-well). However, substrate 111 is not limited to p-type.

Substrate 111 further comprises a plurality of doping regions 311 through 313 extending along the first direction. Doping regions 311 through 313 are spaced apart from one another along the third direction. These doping regions are referred to as first doping region 311, second doping region 312, and third doping region 313.

First through third doping regions 311 through 313 have a second conductivity type that differs from the conductivity type of substrate 111. For example, first through third doping region 311 through 313 can be n-type conductivity regions. First through third doping region 311 through 313 are n-type conductivity regions. However, first through third doping regions 311 through 313 are not limited to n-type.

A plurality of insulation materials 112 and 112a are provided sequentially on substrate 111 along the second direction between adjacent regions of first through third doping region 311 through 313. Insulation materials 112 and 112a are spaced apart along the second direction, and they extend along the first direction. Insulation materials 112 and 112a are typically formed of an insulation material such as a semiconductor oxide film. A portion of insulation material 112a contacting substrate 111 is thinner than other portions of insulation materials 112.

Between two adjacent regions of first through third doping region 311 through 313, a plurality of pillars PL11, PL12, PL21, and PL22 are arranged sequentially along the first direction to penetrate insulation materials 112 and 112a along the second direction. Pillars PL11, PL12, PL21, and PL22 contact substrate 111 through insulation materials 112 and 112a. Pillars PL11, PL12, PL21, and PL22 are formed with a multi-layer structure comprising a channel film 114 and an inner material 115 within channel film 114.

Channel films 114 comprise a semiconductor material (e.g., silicon) having a first conductivity type. For example, channel films 114 can comprise a semiconductor material of the same type as substrate 111. In the description that follows, it is assumed that channel films 114 comprise p-type silicon. However, channel films 114 are not limited to p-type silicon, and they could be formed of other materials, such as a non-conductive intrinsic semiconductor. Inner materials 115 are formed of an insulating material such as silicon oxide or an air gap.

Between two adjacent regions of first through third doping region 311 through 313, information storage films 116 are provided on exposed surfaces of insulation materials 112 and 112a and pillars PL11, PL12, PL21, and PL22. A thickness of information storage films 116 is less than a distance between insulation films 112 and 112a.

Conductive materials CM1 through CM8 are provided on exposed surfaces of information storage films 116 between two adjacent regions of first through third doping region 311 through 313. Conductive materials CM1 through CM8 extend along the first direction, and they can be provided between information storage film provided at a lower surface of an upper-layer insulation material and an information storage film provided at an upper surface of a lower-layer insulation material.

Conductive materials CM1 through CM8 and insulation materials 112 and 112a on first through third doping region 311 through 313 are separated by word line cuts (labeled "WL Cut"). Conductive materials CM1 through CM8 can comprise a metallic conductive material or a nonmetallic conductive material such as polysilicon.

Information storage films 116 formed on an upper surface of an insulation material placed at the uppermost layer among insulation materials 112 and 112a can be removed. For example, information storage films provided at sides opposite to pillars PL11, PL12, PL21, and PL22 among sides of insulation materials 112 and 112a can be removed.

A plurality of drains 320 are formed on pillars PL11, PL12, PL21, and PL22. Drains 320 are typically formed of a semiconductor material (e.g., silicon) having the second conductivity type. For example, drains 320 can be formed of an n-type semiconductor material, such as n-type silicon. In the description that follows, it is assumed that drains 320 are formed of n-type silicon. However, they can be extended to the upside of channel films 114 of pillars PL11, PL12, PL21, and PL22.

Bit lines BL extending in the third direction are provided on drains 320. These bit lines BL are spaced apart in the first direction, and they are coupled with drains 320. In addition, drains 320 and bit lines BL can be connected via contact plugs (not shown). Bit lines BL can be formed of a metallic conductive material or a nonmetallic conductive material such as polysilicon.

Rows and columns of pillars PL11, PL12, PL21, and PL22 can be defined by the separation of conductive materials CM1 through CM8. In FIGS. 4 through 6, conductive materials CM1 through CM8 are separated by second doping region 312.

Pillars PL11 and PL12, which are coupled with conductive materials CM1 through CM8 between first and second doping regions 311 and 312 information storage films 116, are defined as a first row of pillars, and pillars PL21 and PL22, which are coupled with conductive materials CM1 through CM8 between the second and third doping regions 312 and 313 via information storage films 116, are defined as a second row of pillars.

Columns of pillars PL11, PL12, PL21, and PL22 are defined according to bit lines BL1 and BL2. Pillars PL11 and PL21 connected with first bit line BL1 via drains 320 are be defined as a first column. Pillars PL12 and PL22 connected with second bit line BL1 via drains 320 may be defined as a second column.

Conductive materials CM1 through CM8 have first through eighth heights according to their distances from substrate 111. First conductive material CM1 closest to substrate 111 has the first height, and eighth conductive material CM8 closest to a bit line has the eighth height.

Pillars PL11, PL12, PL21, and PL22 form a plurality of cell strings together with information storage films 116 and conductive materials CM1 through CM8. That is, each of pillars PL11, PL12, PL21, and PL22 forms a cell string with one of information storage films 116 and an adjacent one of conductive materials CM1 through CM8. Each cell string comprises a plurality of cell transistors CT stacked in a direction perpendicular to substrate 111. Examples of cell transistors CT are more fully described with reference to FIG. 7.

Figure 7:
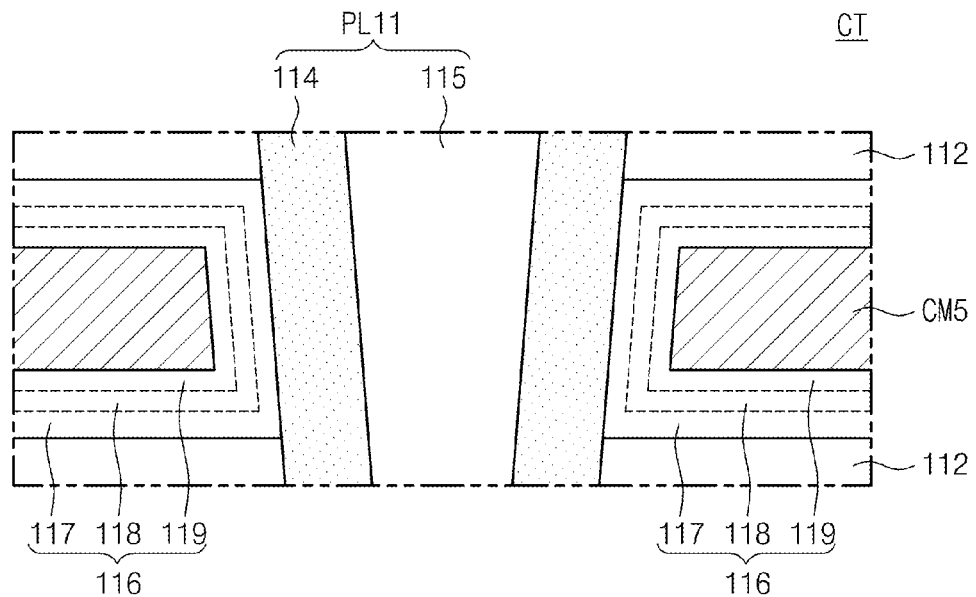
FIG. 7 is a diagram illustrating a cell transistor shown in FIG. 6 according to an embodiment of the inventive concept.

FIG. 7 is a diagram illustrating one of cell transistors CT in FIG. 6 according to an embodiment of the inventive concept. In the embodiment of FIG. 7, the cell transistor has the fifth height corresponding to pillar PL11 of the first row and the first column.

Referring to FIGS. 4 through 7, cell transistors CT are formed of fifth conductive material CM5, a portion of a pillar PL11 adjacent to fifth conductive material CM5, and information storage films 116 between fifth conductive material CM5 and pillar PL11.

Information storage films 116 extend to upper surfaces and lower surfaces of conductive materials CM1 through CM8 from regions between conductive materials CM1 through CM8 and pillars PL11, PL12, PL21, and PL22. Each of information storage films 116 comprises first through third sub insulation films 117, 118, and 119.

In cell transistors CT, channel films 114 of pillars PL11, PL12, PL21, and PL22 are formed of the same type of p-type silicon as substrate 111. Channel films 114 act as bodies of cell transistors CT. Channel films 114 are formed in a direction perpendicular to substrate 111. Channel films 114 of pillars PL11, PL12, PL21, and PL22 act as a vertical body. Vertical channels are formed in channel films 114.

First sub insulation films 117 adjacent to pillars PL11, PL12, PL21, and PL22 act as tunneling insulation films of cell transistors CT. For example, first sub insulation films 117 adjacent to pillars PL11, PL12, PL21, and PL22 can comprise a thermal oxide film, such as a silicon oxide film.

Second sub insulation films 118 function as charge storage films of cell transistors CT. For example, second sub insulation films 118 can function as charge trap films formed of a nitride film or a metal oxide film such as an aluminum oxide film or a hafnium oxide film. Second sub insulation films 118 are formed of a silicon nitride film.

Third sub insulation films 119 adjacent to conductive materials CM1 through CM8 act as blocking insulation films of cell transistors CT. Moreover, third sub insulation films 119 can be formed of a single layer or multiple layers. Third sub insulation films 119 typically comprise high dielectric films (e.g., aluminum oxide films or hafnium oxide films) having a dielectric constant larger than first and second sub insulation films 117 and 118. For example, third sub insulation films 119 can comprise silicon oxide films. Moreover, in some embodiments, first through third sub insulation films 117 through 119 can form an oxide-nitride-oxide (ONO) structure.

Conductive materials CM1 through CM8 act as gates, such as control gates, third sub insulation films 119 act as block insulation films, second sub insulation films 118 act as charge storage films, first sub insulation films 117 act as tunneling insulation films, and channel films 114 act as vertical bodies. Collectively, these features operate as cell transistors CT stacked in a direction perpendicular to substrate 111. In this example, cell transistors CT are charge trap type cell transistors.

Cell transistors CT can be used for different purposes according to their respective heights. For example, among cell transistors CT, at least one cell transistor placed at an upper portion can be used as a string selection transistor, and at least one cell transistor placed at a lower portion is used as a ground selection transistor. Remaining cell transistors between cell transistors used as string and ground selection transistors can be used as memory cells and dummy memory cells.

Conductive materials CM1 through CM8 extend along a row direction (or, the first direction) to be connected with pillars PL11 and PL12 or PL21 and PL22. Conductive materials CM1 through CM8 constitute conductive lines interconnecting cell transistors CT of the same row of pillars PL11 and PL12 or PL21 and PL22. Conductive materials CM1 through CM8 can also be used as string selection lines SSL, ground selection lines GSL, word lines WL, and dummy words line DWL according to their respective heights.

Figure 8:
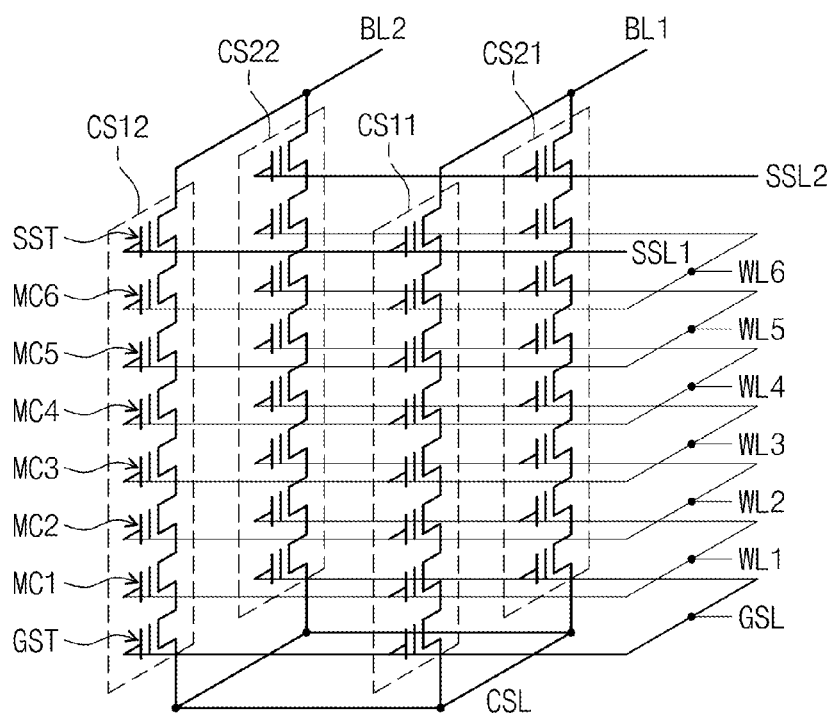
FIG. 8 is a circuit diagram of a memory block according to an embodiment of the inventive concept.

FIG. 8 is a circuit diagram of a memory block according to an embodiment of the inventive concept.

Referring to FIGS. 4 through 8, cell strings CS11 and CS21 are connected between first bit line BL1 and a common source line CSL, and cell strings CS12 and CS22 are connected between second bit line BL2 and common source line CSL. Cell strings CS11, CS21, CS12, and CS22 correspond to pillars PL11, PL21, PL12, and PL22, respectively.

Pillar PL11 of the first row and the first column constitutes a cell string CS11 of the first row and the first column with conductive materials CM1 and CM8 and information storage films 116. Pillar PL12 of the first row and the second column constitutes a cell string CS12 of the first row and the second column with conductive materials CM1 and CM8 and information storage films 116. Pillar PL21 of the second row and the first column constitutes a cell string CS21 of the second row and the first column with conductive materials CM1 and CM8 and information storage films 116. Pillar PL21 of the second row and the second column constitutes a cell string CS22 of the second row and the second column with conductive materials CM1 and CM8 and information storage films 116.

In cell strings CS11, CS21, CS12, and CS22, cell transistors having the first height act as ground selection transistors GST. Cell strings of the same row can share a ground selection line GSL, and cell strings in different rows can share ground selection line GSL. Ground selection line GSL can be formed by interconnecting first conductive materials CM1.

In cell strings CS11, CS21, CS12, and CS22, cell transistors having the second through sixth heights act as first through sixth memory cells MC1 through MC6. First through sixth memory cells MC1 through MC6 are connected with first through sixth word lines WL1 through WL6, respectively. Memory cells having the same height share a word line, whether they are in the same row or different rows.

First word line WL1 is formed by connecting second conductive materials CM2 in common, second word line WL2 is formed by connecting the third conductive materials CM3 in common, third word line WL3 is formed by connecting fourth conductive materials CM4 in common, fourth word line WL4 is formed by connecting fifth conductive materials CM5 in common, fifth word line WL5 is formed by connecting sixth conductive materials CM6 in common, and sixth word line WL6 is formed by connecting seventh conductive materials CM7 in common.

In cell strings CS11, CS21, CS12, and CS22, cell transistors having the eighth height act as string selection transistors SST. String selection transistors SST are connected with first and second string selection lines SSL1 and SSL2, respectively. Cell strings in the same row share a string selection line, and cell strings in different rows are connected with different selection lines SSL1 and SSL2. Pillars PL11, PL12, PL21, and PL22, which correspond to rows of cell strings CS11, CS12, CS21, and CS22, are defined by first and second string selection lines SSL1 and SSL2.

Common source line CSL is connected in common with cell strings CS11, CS12, CS21, and CS22. For example, common source line CSL is formed by interconnecting first through third doping regions 311 through 313 (See FIGS. 4 through 6).

As described above, string selection lines SSL1 and SSL2, word lines WL1 through WL6, and ground selection line GSL in a selected memory block are connected with address decoder 130 via a pass circuit of block gating unit 120 corresponding to the selected memory block. Address decoder 130 selects string selection lines SSL1 and SSL2, word lines WL1 through WL6, and ground selection line GSL of the selected memory block.

Memory cells at the same height are connected in common with one word line. Accordingly, where a word line at a specific height is selected, all cell strings CS11, CS12, CS21, and CS22 connected with the selected word line are selected.

Cell strings in different rows are connected with different string selection lines. Cell strings CS11 and CS12 or CS21 and CS22 in an unselected row among cell strings CS11, CS12, CS21, and CS22 connected with the same word line may be separated from bit lines BL1 and BL2 by selecting and unselecting the first and second string selection lines SSL1 and SSL2. Cell strings CS21 and CS22 or CS11 and CS12 in a selected row are electrically connected with bit lines BL1 and BL2.

That is, rows of cell strings CS11, CS12, CS21, and CS22 are selected by selecting and unselecting first and second string selection lines SSL1 and SSL2. Columns of cell strings in a selected row can be selected by selecting the bit lines BL1 and BL2.

String selection lines SSL1 and SSL2, word lines WL1 through WL6, and ground selection line GSL in unselected memory blocks are electrically separated from address decoder 130 via pass circuits of block gating unit 120 corresponding to the unselected memory blocks. Ground circuits of block gating unit 120 corresponding to the unselected memory blocks supply a low voltage (e.g., ground voltage VSS) to string selection lines SSL1 and SSL2 and ground selection line GSL in each of the unselected memory blocks. With these bias conditions, string and ground selection transistors SST and GST in the unselected memory blocks are turned off so as to be electrically separated from bit lines BL1 and BL2 and common source line CSL.

In FIGS. 4 through 8, memory blocks BLKa and BLKa1 comprise 2×2 cell strings each having first through eighth heights. However, the heights of these strings can be made proportional to the number of cell strings. Moreover, in some embodiments, memory block BLKa and BLKa1 are designed with first through eighth heights, where each of them comprises 8×8 cell strings. In such embodiments, these memory blocks can be connected with eight string selection lines and one ground selection line. Similarly, in some embodiments, memory block BLKa and BLKa1 are designed with first through sixteenth heights, where each of them comprises 8×8 cell strings. In such embodiments, these memory blocks can be connected with sixteen string selection lines and one ground selection line.

In the description that follows, it will be assumed that memory block BLKa or BLKa1 is connected with "n" string selection lines and one ground selection line. Further, it is assumed that memory block BLKa or BLKa1 is connected with "m" word lines.

Figure 9:
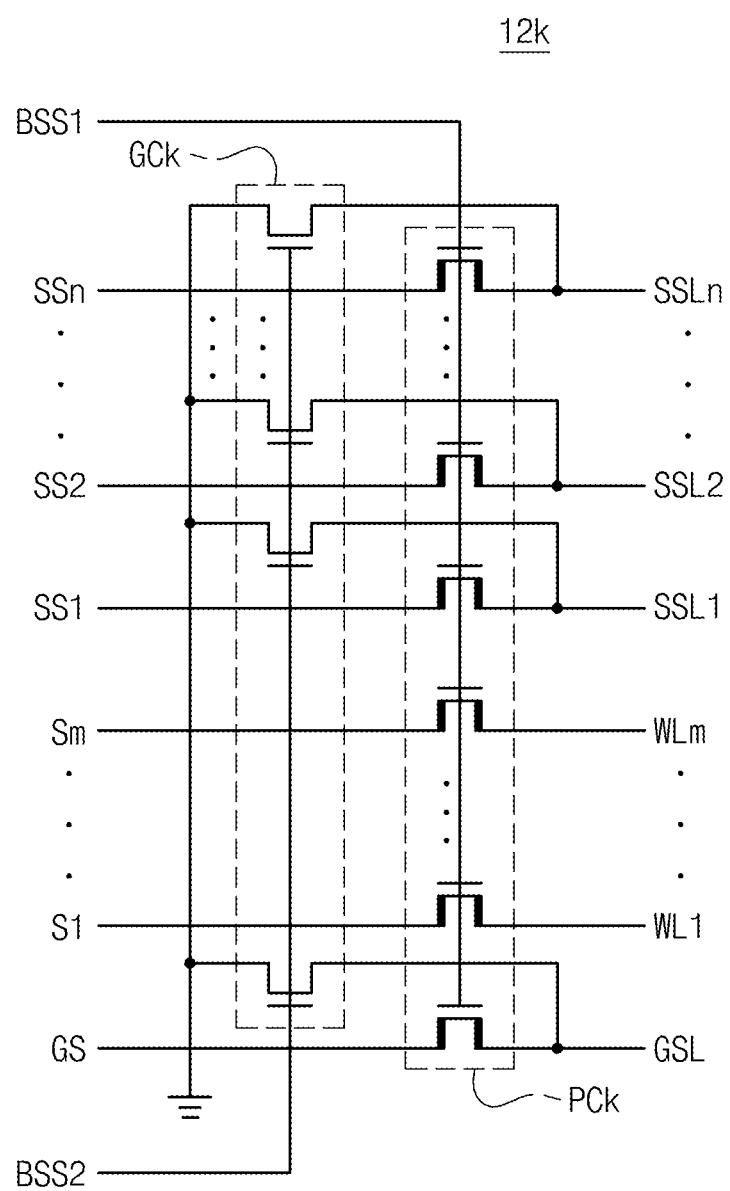
FIG. 9 is a circuit diagram of a gating circuit shown in FIG. 2 according to an embodiment of the inventive concept.

FIG. 9 is a circuit diagram illustrating one of gating circuits 121 through 12z shown in FIG. 2 according to an embodiment of the inventive concept.

Referring to FIG. 9, a gating circuit 12k comprises a pass circuit PCk and a ground circuit GCk. Pass circuit PCk comprises a plurality of pass transistors. In response to a first block selection line BSS1, the pass transistors connect string selection lines SSL1 through SSLn, word lines WL1 through WLm, and a ground selection line GSL with string lines SS1 through SSn, selection lines S1 through Sm, and a ground line GS, respectively. The pass transistors can be formed of high-voltage transistors, for example.

Ground circuit GCk comprises a plurality of ground transistors that supply a low voltage to string selection lines SSL1 through SSLn and ground line GSL in response to second block selection signal BSS2. The low voltage supplied by the ground transistors can be ground voltage VSS, for example.

The activated first block selection signal BSS1 is supplied to a pass circuit corresponding to a selected one of memory blocks BLK1 through BLKz. The activated second block selection signal BSS2 is supplied to ground circuits each corresponding to unselected ones of memory blocks BLK1 through BLKz. Under these bias conditions, string selection lines SSL1 through SSLn, word line WL1 through WLm, and ground selection line GSL of the selected block are coupled with address decoder 130, while string selection lines SSL1 through SSLn and ground selection line GSL of unselected memory blocks are grounded. At this time, word lines WL1 through WLm of the unselected memory blocks are floated. The unselected memory blocks are separated from bit lines BL and a common source line CSL.

Figure 10:
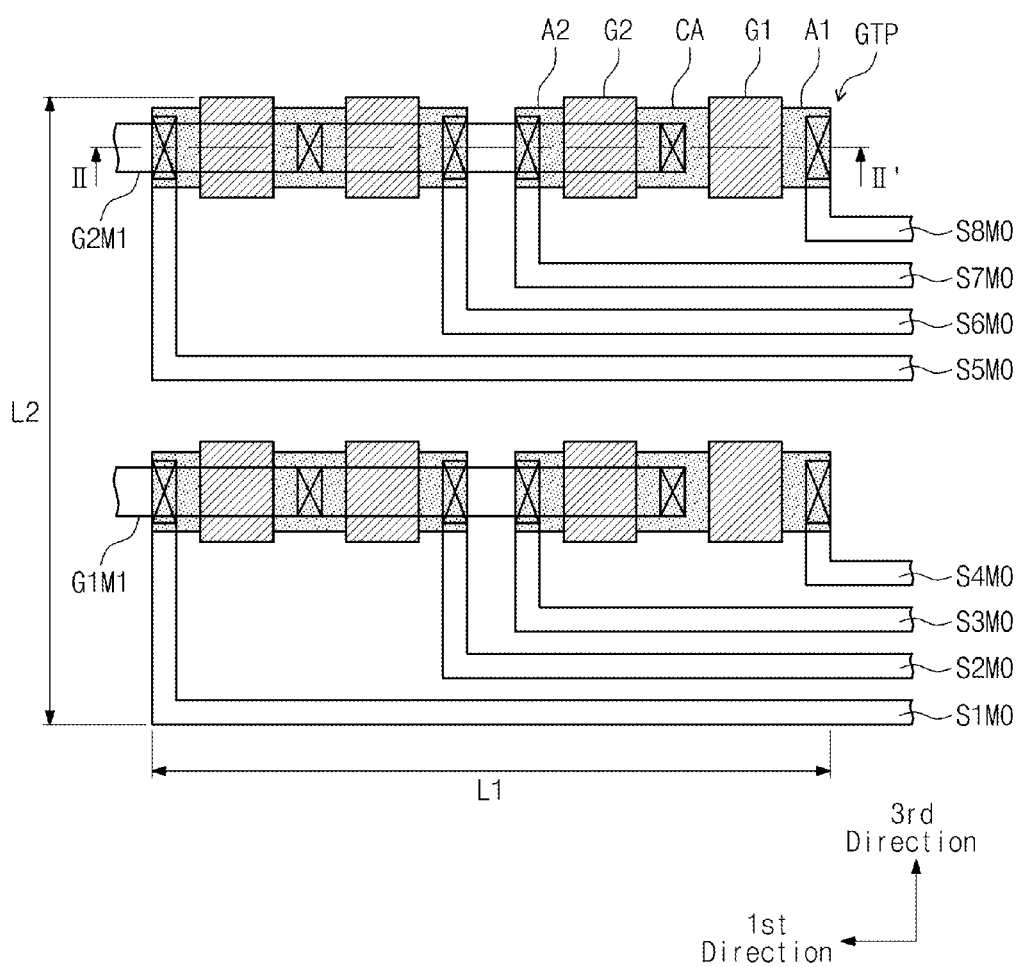
FIG. 10 is a plane view of ground transistors in a ground circuit of FIG. 9 according to an embodiment of the inventive concept.
Figure 11:
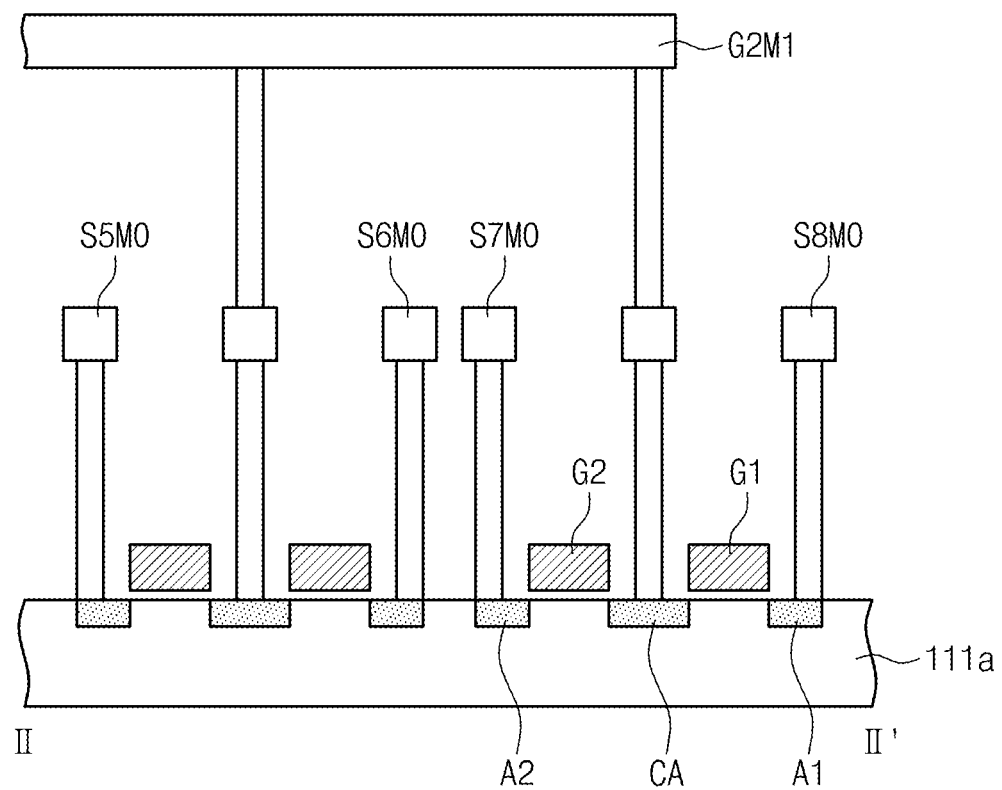
FIG. 11 is a cross-sectional view taken along a line II-II' in FIG. 10.

FIG. 10 is a plane view of ground transistors in ground circuit GCk according to an embodiment of the inventive concept, and FIG. 11 is a cross-sectional view taken along a line II-II' in FIG. 10.

Referring to FIGS. 9 through 11, a plurality of ground transistor pairs GTP each comprise first and second gate patterns G1 and G2, first and second active regions A1 and A2 each formed beside one of first and second gate patterns G1 and G2, and a common active region CA formed between first and second gate patterns G1 and G2.

First active region A1, common active region CA, and first gate pattern G1 form one ground transistor of a ground transistor pair GTP, and second active region A2, common active region CA, and second gate pattern G2 form another ground transistor of the ground transistor pair GTP.

First active region A1 is connected with one of first metal lines S1M0 through S8M0 via a contact plug CP, and second active region A2 is connected with another one of first metal lines S1M0 through S8M0 via a contact plug CP. First metal lines S1M0 through S8M0 are formed from metal layer ML described in FIG. 3. First metal lines S1M0 through S8M0 extend in the first direction on a memory block BLKk. As illustrated in FIG. 3, first metal lines S1M0 through S8M0 are connected with conductive materials CM1 through CM8 of memory block BLKk via contact plugs CP, respectively. That is, ground transistor pairs GTP are connected with memory block BLKk via first metal lines S1M0 through S8M0. First metal lines S1M0 through S8M0 form string selection lines SSL1 through SSLn and ground selection line GSL.

Common active region CA is connected with one of second metal lines G1M1 and G2M1 via a contact plug CP. Second metal lines G1M1 and G2M1 are formed from metal layer ML described in FIG. 3. Second metal lines G1M1 and G2M1 are formed over first metal lines S1M0 through S8M0. Second metal lines G1M1 and G2M1 are interconnected, and a ground voltage is applied to second metal lines G1M1 and G2M1.

The ground transistors of FIG. 10 comprise channels formed in a direction parallel with first metal lines S1M0 through S8M0 constituting string selection lines SSL1 through SSLn and ground selection line GSL. Second metal lines G1M1 and G2M1 are disposed over ground transistor pairs GTP. First metal lines S1M0 through S8M0 are disposed among ground transistor pairs GTP.

In some embodiments, four ground transistor pairs GTP for supplying a ground voltage to eight first metal lines S1M0 through S8M0 occupy an area defined by a first length L1 in the first direction and a second length L2 in the third direction.

Figure 12:
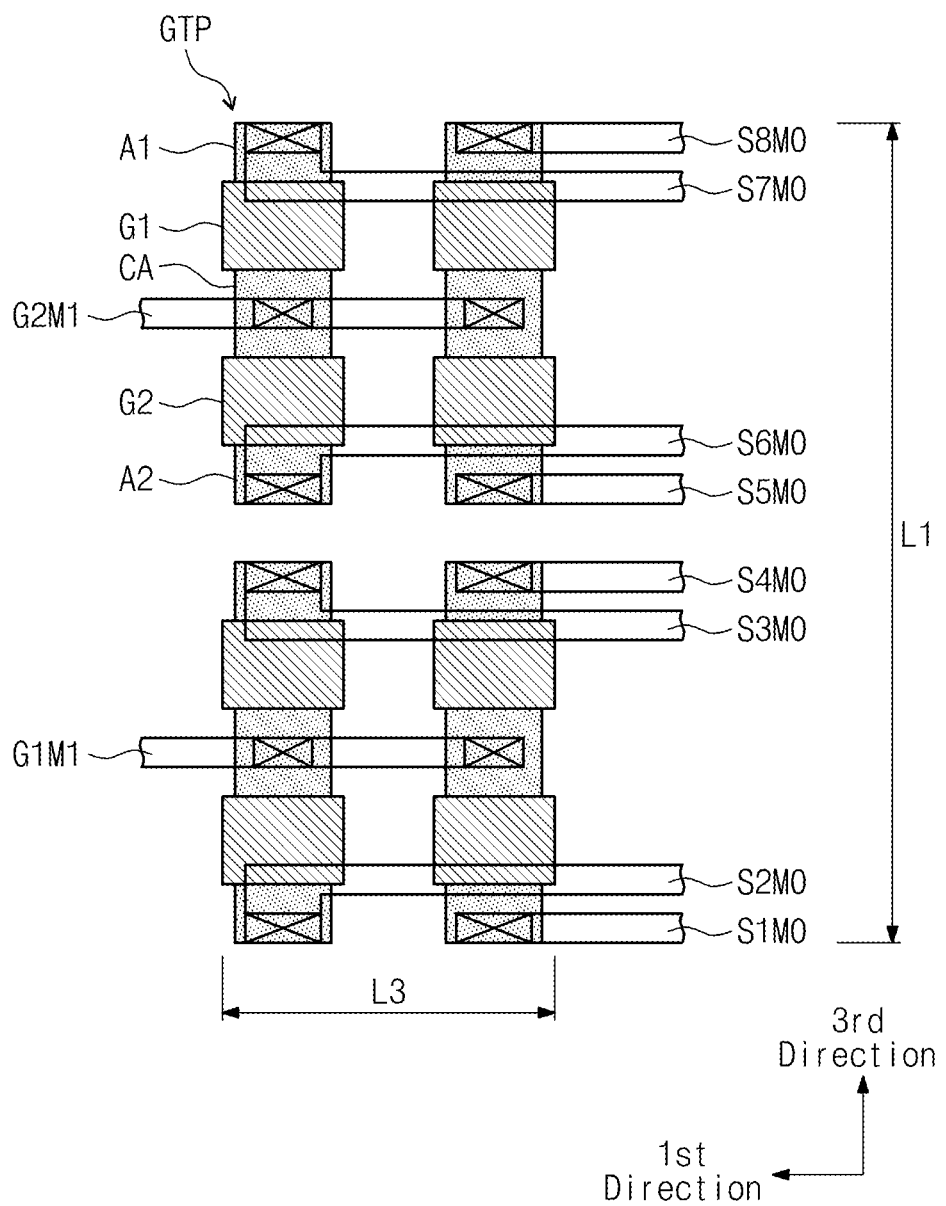
FIG. 12 is a plane view of ground transistors according to an embodiment of the inventive concept.

FIG. 12 is a plane view of ground transistors according to an embodiment of the inventive concept.

Referring to FIGS. 9 and 12, first metal lines S1M0 through S8M0 are formed along the first direction. First metal lines S1M0 through S8M0 are formed of metal layer ML. First metal lines S1M0 through S8M0 form string selection lines SSL1 and SSL2 and a ground selection line GSL of memory block BLKk.

Second metal lines G1M1 and G2M1 are formed along the first direction. Second metal lines G1M1 and G2M1 are formed of metal layer ML. Second metal lines G1M1 and G2M1 are formed over first metal lines S1M0 through S8M0. A ground voltage is applied to second metal lines G1M1 and G2M1.

Ground transistor pairs GTP comprise channels that extend along a direction perpendicular to first and second metal lines S1M0 through S8M0 and G1M1 and G2M1. Where the channels of ground transistor pairs GTP are perpendicular to first metal lines S1M0 through S8M0, first metal lines S1M0 through S8M0 are disposed over ground transistor pairs GTP. Because a space is not required to dispose first metal lines S1M0 through S8M0, the integrity of the ground transistors is improved.

In some embodiments, four ground transistor pairs GTP for supplying a ground voltage to eight first metal lines S1M0 through S8M0 occupy an area defined by third length L3 in the first direction and first length L1 in the third direction. Third length L3 is shorter than second length L2 described in FIGS. 10 and 11.

Figure 13:
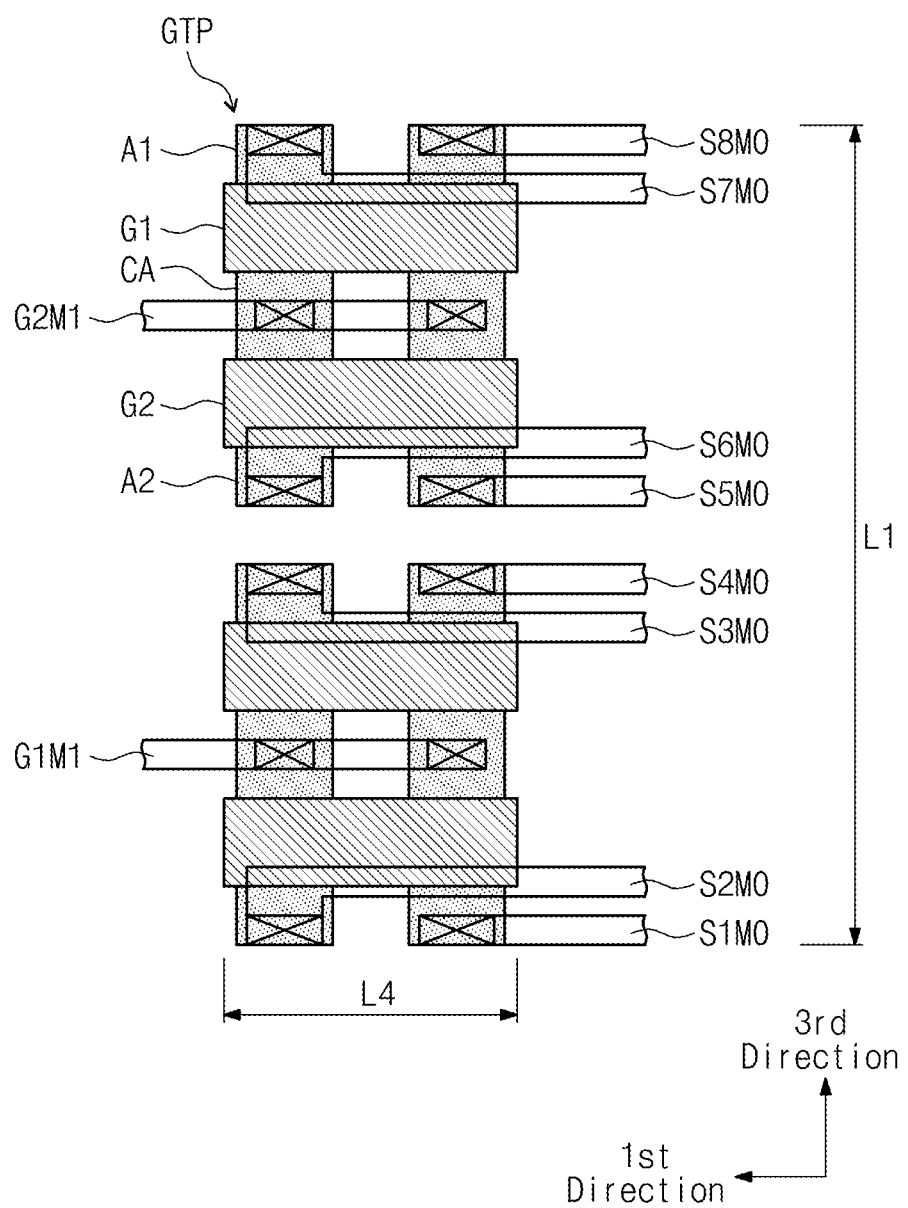
FIG. 13 is a plane view of ground transistors in the ground circuit of FIG. 9 according to an embodiment of the inventive concept.

FIG. 13 is a plane view of ground transistors according to an embodiment of the inventive concept. This embodiment differs from the embodiment of FIG. 12 in that first and second gate patterns G1 and G2 extend along the first direction and are interconnected.

A plurality of first active regions A1 are formed at one end of first and second gate patterns G1 and G2, a plurality of second active regions A2 are formed at other ends thereof, and common active regions CA are formed between first gate patterns G1 and G2. First and second gate patterns G1 and G2, first and second active regions CA, and common active regions CA form a plurality of ground transistors. In these ground transistors, a space is not required to separate gate patterns G1 and G2. Accordingly, the integrity of the ground transistors is improved.

In some embodiments, four ground transistor pairs GTP for supplying a ground voltage to eight first metal lines S1M0 through S8M0 occupy an area defined by a fourth length L4 in the first direction and first length L1 in the third direction. Fourth length L4 is shorter than third length L3 described in FIG. 12.

Figure 14:
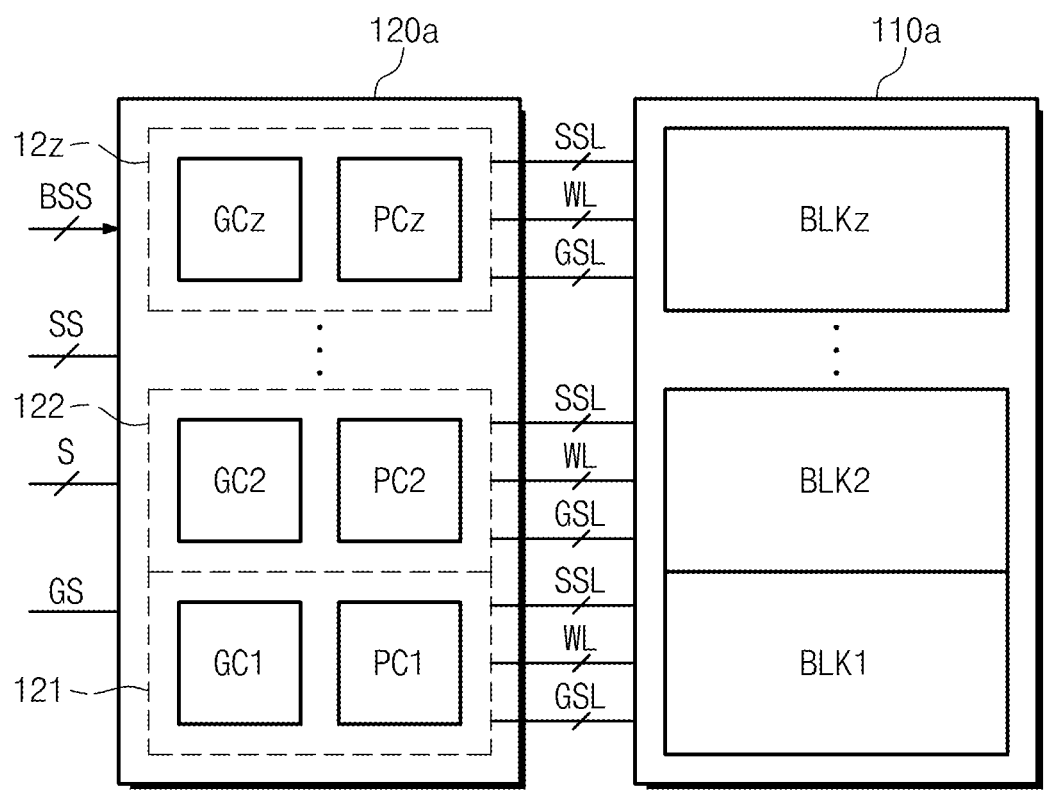
FIG. 14 is a block diagram of the memory cell array and the block gating unit of FIG. 1 according to an embodiment of the inventive concept.

FIG. 14 is a block diagram of memory cell array 110 and block gating unit 120 of FIG. 1 according to an embodiment of the inventive concept. In FIG. 14, memory cell array 110 is labeled 110a, and block gating unit 120 is labeled 120a.

Referring to FIG. 14, memory cell array 110a comprises a plurality of memory blocks BLK1 through BLKz each connected with a plurality of string selection lines SSL, a plurality of word lines WL, and a plurality of ground selection lines GSL.

Block gating unit 120a comprises ground circuits GC1 through GCz and pass circuits PC1 through PCz. Ground circuits GC1 through GCz correspond to memory blocks BLK1 through BLKz, respectively, and pass circuits PC1 through PCz correspond to memory blocks BLK1 through BLKz, respectively. Each of pass circuits PC1 through PCz is connected with a corresponding memory block via string selection lines SSL, word lines WL, and ground selection lines GSL. Each of ground circuits GC1 through GCz is connected with a corresponding memory block via string selection lines SSL and ground selection lines GSL.

Figure 15:
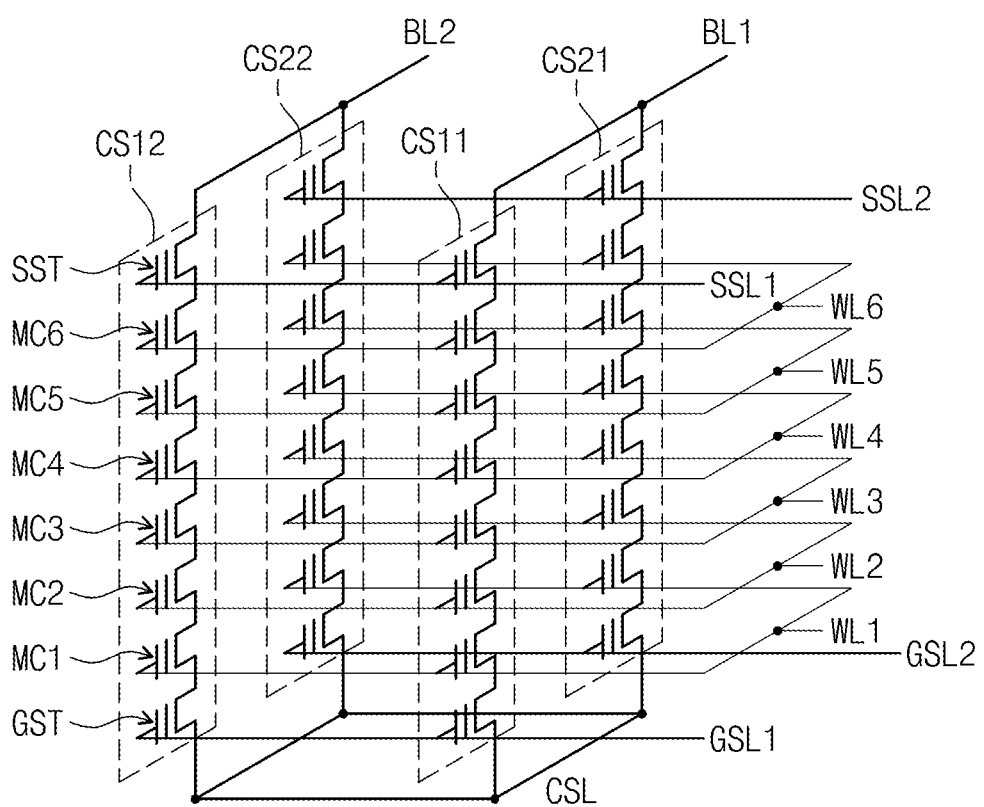
FIG. 15 is a circuit diagram of a memory block according to an embodiment of the inventive concept.

FIG. 15 is a circuit diagram of a memory block according to an embodiment of the inventive concept. The memory block of FIG. 15 is similar to that of FIG. 8 except that it further comprises a plurality of ground selection lines GSL.

Figure 16:
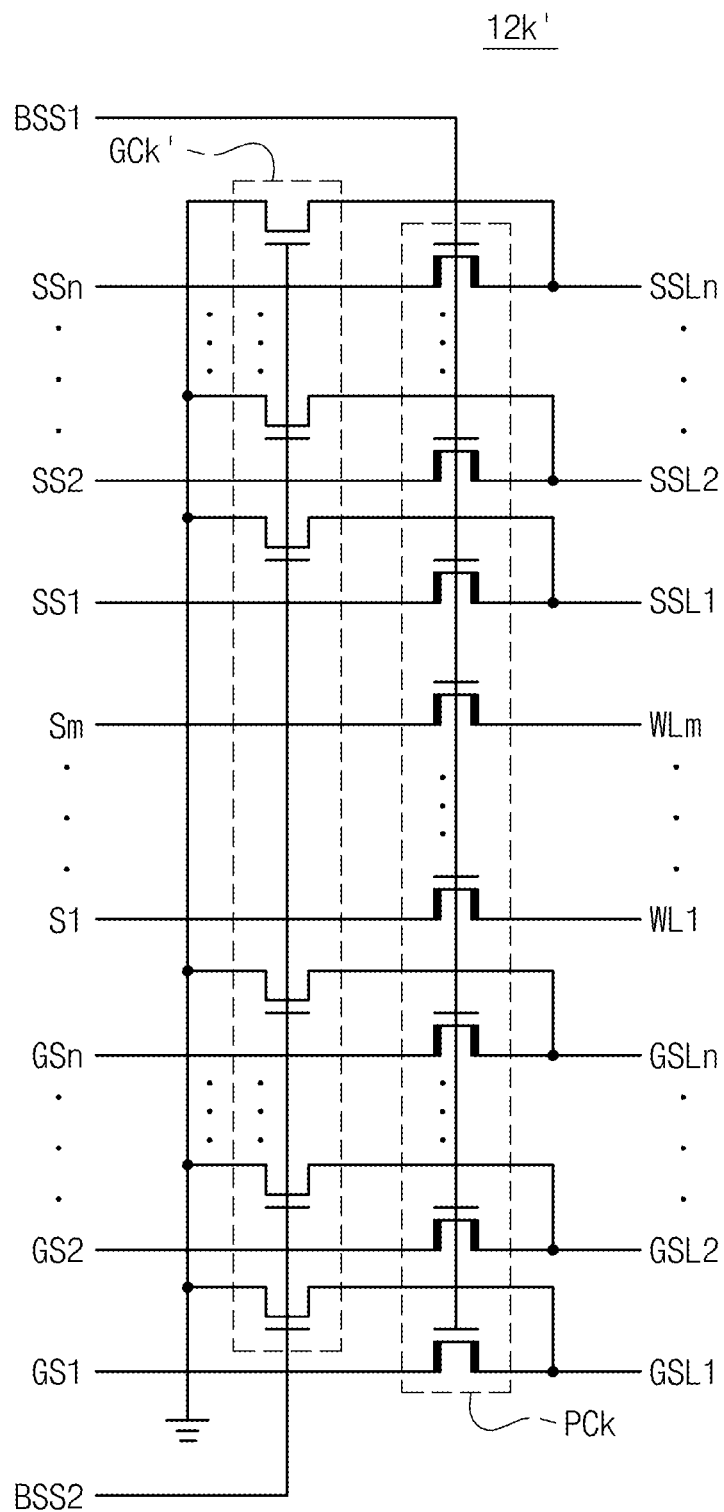
FIG. 16 is a circuit diagram of a gating circuit shown in FIG. 14 according to an embodiment of the inventive concept.

FIG. 16 is a circuit diagram of one of gating circuits 121 and 12z shown in FIG. 14 according to an embodiment of the inventive concept.

Referring to FIG. 16, a gating circuit 12k comprises a pass circuit PCk' and a ground circuit GCk'. Pass circuit PCk' comprises a plurality of pass transistors. The pass transistors connect string selection lines SSL1 through SSLn, word lines WL1 through WLm, and ground selection lines GSL1 through GSLn with address decoder 130 in response to first block selection signal BSS1.

Ground circuit GCk' comprises a plurality of ground transistors. The ground transistors supply ground voltage VSS to string selection lines SSL1 through SSLn and ground selection lines GSL1 through GSLn in response to second block selection signal BSS2. The ground transistors can be formed as described in any of FIGS. 10 through 13.

Figure 17:
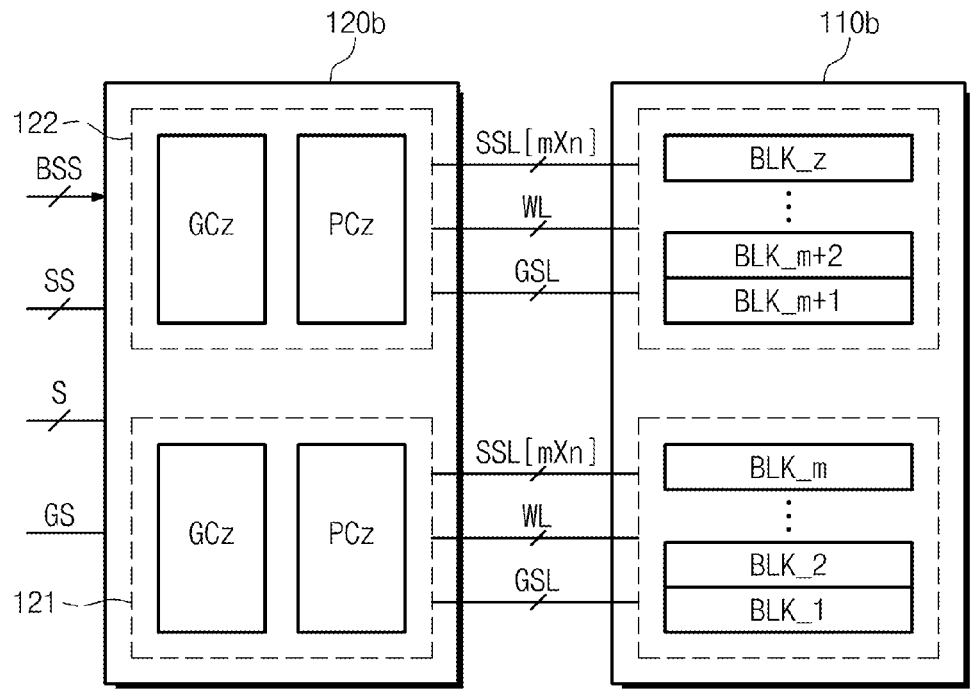
FIG. 17 is a block diagram of the memory cell array and the block gating unit of FIG. 1 according to an embodiment of the inventive concept.

FIG. 17 is a block diagram of memory cell array 110 and block gating unit 120 of FIG. 1 according to an embodiment of the inventive concept. In FIG. 17, memory cell array 110 is labeled 110b, and block gating unit 120 is labeled 120b.

Referring to FIG. 17, memory cell array 110b comprises a plurality of memory blocks BLK1 through BLKz arranged in two groups. In alternative embodiments, they can be arranged in different numbers of groups.

Block gating unit 120b comprises a plurality of gating circuits 121 and 122. In some embodiments, the number of gating circuits is identical to the number of groups of memory blocks. Gating circuits 121 and 122 are used to select or unselect the groups of memory blocks.

Gating circuits 121 and 122 connect string selection lines SSL, word lines WL, and ground selection lines GSL of a selected memory block group with address decoder 130 in response to block selection signal BSS. Gating circuits 121 and 122 supply ground voltage VSS to string selection lines SSL and ground selection lines GSL of an unselected memory block group.

Gating circuits 121 and 122 comprise ground circuits GC1 and GC2 and pass circuits PC1 and PC2. Ground circuits GC1 and GC2 can be configured as described in FIGS. 9 through 13 and 16.

Figure 18:
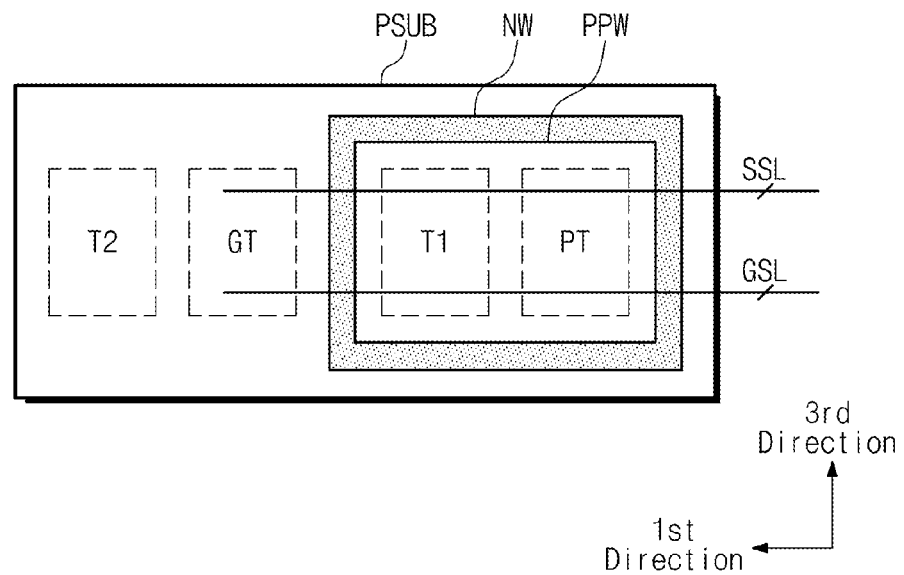
FIG. 18 is a plane view of a block gating unit according to an embodiment of the inventive concept.

FIG. 18 is a plane view of a block gating unit according to an embodiment of the inventive concept.

Referring to FIG. 18, the block gating unit comprises a p-type substrate PSUB, an n-type well NW, and a p-type pocket well PPW.

A first transistor T1 and a pass transistors PT are formed on pocket p-well PPW, and second transistors T2 and ground transistors GT are formed on substrate PSUB. First and second transistors T1 and T2 are elements constituting block gating unit 120. For example, first and second transistors T1 and T2 can constitute logic gates of block gating unit 120.

Substrate PSUB and the pocket p-well PPW can be biased differently. For example, substrate PSUB can be biased by ground voltage VSS, and pocket p-well PPW can be biased by a negative voltage.

In some embodiments, first metal lines S1M0 through S8M0 (see FIG. 13) forming string selection lines SSL and ground selection lines GSL extend along the first direction to be connected with pass transistors PT. First metal lines S1M0 through S8M0 further extend along the first direction to be connected with ground transistors GT.

Figure 19:
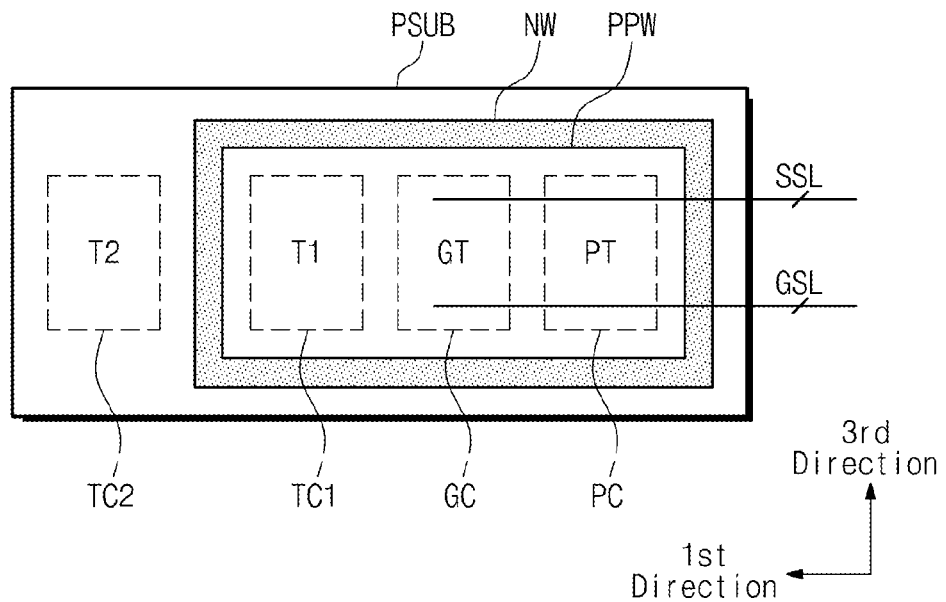
FIG. 19 is a plane view of a block gating unit according to an embodiment of the inventive concept.

FIG. 19 is a plane view of a block gating unit according to an embodiment of the inventive concept.

Referring to FIG. 19, the block gating unit comprises second transistor T2 formed on a substrate PSUB. First transistors T1, pass transistors PT, and ground transistors GC are formed on pocket p-well PPW.

Substrate PSUB and pocket p-well PPW are biased differently. For example, substrate PSUB is biased by ground voltage VSS, and pocket p-well PPW is biased by a negative voltage.

In some embodiments, first metal lines S1M0 through S8M0 (refer to FIG. 13) forming string selection lines SSL and ground selection lines GSL extend along the first direction to be connected with pass transistors PT. First metal lines S1M0 through S8M0 further extend along the first direction to be connected with ground transistors GT.

Compared with block gating unit of FIG. 18, the block gating unit of FIG. 19 omits transistors between ground transistors GT and pass transistors PT. Accordingly, bussing of first metal lines S1M0 through S8M0 and structural integrity may be improved.

Figure 20:
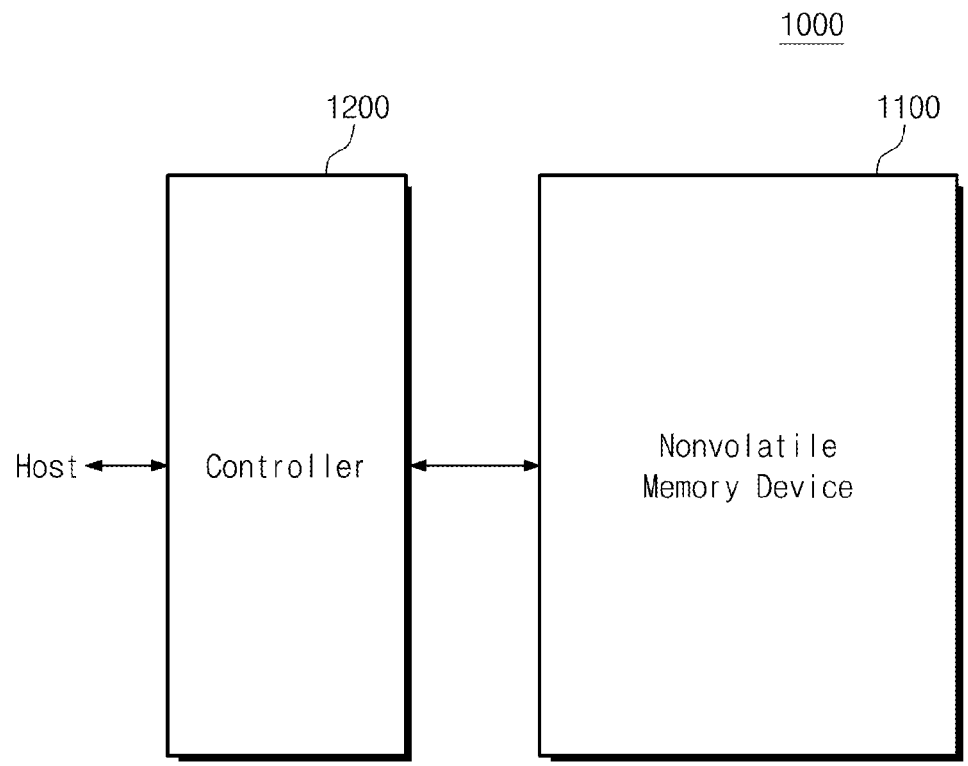
FIG. 20 is a block diagram of a memory system according to an embodiment of the inventive concept.

FIG. 20 is a block diagram of a memory system 1000 according to an embodiment of the inventive concept.

Referring to FIG. 20, a memory system 1000 comprises a nonvolatile memory device 1100 and a controller 1200. Nonvolatile memory device 1100 has substantially the same structure and functionality as a nonvolatile memory device 100. Controller 1200 is coupled with a host and nonvolatile memory device 1100. Controller 1200 is configured to access nonvolatile memory device 1100 in response to a request from the host. Controller 1200 is configured to control read, program, erase, and background operations of nonvolatile memory device 1100, for example. Controller 1200 is configured to provide an interface between nonvolatile memory device 1100 and the host. Controller 1200 is configured to drive firmware for controlling the nonvolatile memory device 1100.

Controller 1200 is configured to provide a control signal CTRL and an address ADDR to nonvolatile memory device 1100. Nonvolatile memory device 1100 is configured to perform read, program, and erase operations according to control signal CTRL and address ADDR provided from controller 1200.

In some embodiments, controller 1200 further comprises a RAM, a processing unit, a host interface, and a memory interface. The RAM is used as at least one of a working memory of the processing unit, a cache memory between the nonvolatile memory device 1100 and the host or a buffer memory between the nonvolatile memory device 1100 and the host. The processing unit controls overall operation of controller 1200.

The host interface implements a protocol for data exchange between host and controller 1200. For example, the host interface can communicate with an external device (e.g., the host) using a standard protocol such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, and an integrated drive electronics (IDE) protocol. The memory interface interfaces with nonvolatile memory device 1100. The memory interface can comprise, for instance, a NAND flash interface or a NOR flash interface.

Memory system 1000 can further comprise an ECC block configured to detect and correct errors in data read from nonvolatile memory device 1100. The ECC block can be provided as an element of controller 1200 or as an element of nonvolatile memory device 1100.

Controller 1200 and nonvolatile memory device 1100 can be integrated in a single semiconductor device. For example, controller 1200 and nonvolatile memory device 1100 can be integrated to form a memory card such as a PC or PCMCIA card, a CF card, an SM or SMC card, a memory stick, a multimedia card such as an MMC, RS-MMC, or MMCmicro card, a security card such as an SD card, a miniSD card, a microSD card, or an SDHC card, or a universal flash storage (UFS) device.

Controller 1200 and nonvolatile memory device 1100 can also be integrated in a single semiconductor device to form a solid state drive (SSD). Where memory system 1000 is used in an SSD, it can improve the operating speed of a host coupled with memory system 1000.

Memory system 1000 can also be used in a computer, portable computer, ultra mobile PC (UMPC), workstation, net-book, PDA, web tablet, wireless phone, mobile phone, smart phone, e-book, PMP (portable multimedia player), digital camera, digital audio recorder/player, digital picture/video recorder/player, portable game machine, navigation system, black box, 3-dimensional television, a device capable of transmitting and receiving information at a wireless circumstance, one of various electronic devices constituting home network, one of various electronic devices constituting computer network, one of various electronic devices constituting telematics network, RFID, and many other types of devices.

Nonvolatile memory device 1100 and/or memory system 1000 can be packaged in various types of packages or package configurations, such as package on package (PoP), ball grid arrays (BGAs), chip scale packages (CSPs), plastic leaded chip carrier (PLCC), plastic dual in-line package (PDI2P), die in waffle pack, die in wafer form, chip on board (COB), ceramic dual in-line package (CERDIP), plastic metric quad flat pack (MQFP), small outline integrated circuit (SOIC), shrink small outline package (SSOP), thin small outline (TSOP), thin quad flatpack (TQFP), system in package (SIP), multi chip package (MCP), wafer-level fabricated package (WFP), and wafer-level processed stack package (WSP).

Figure 21:
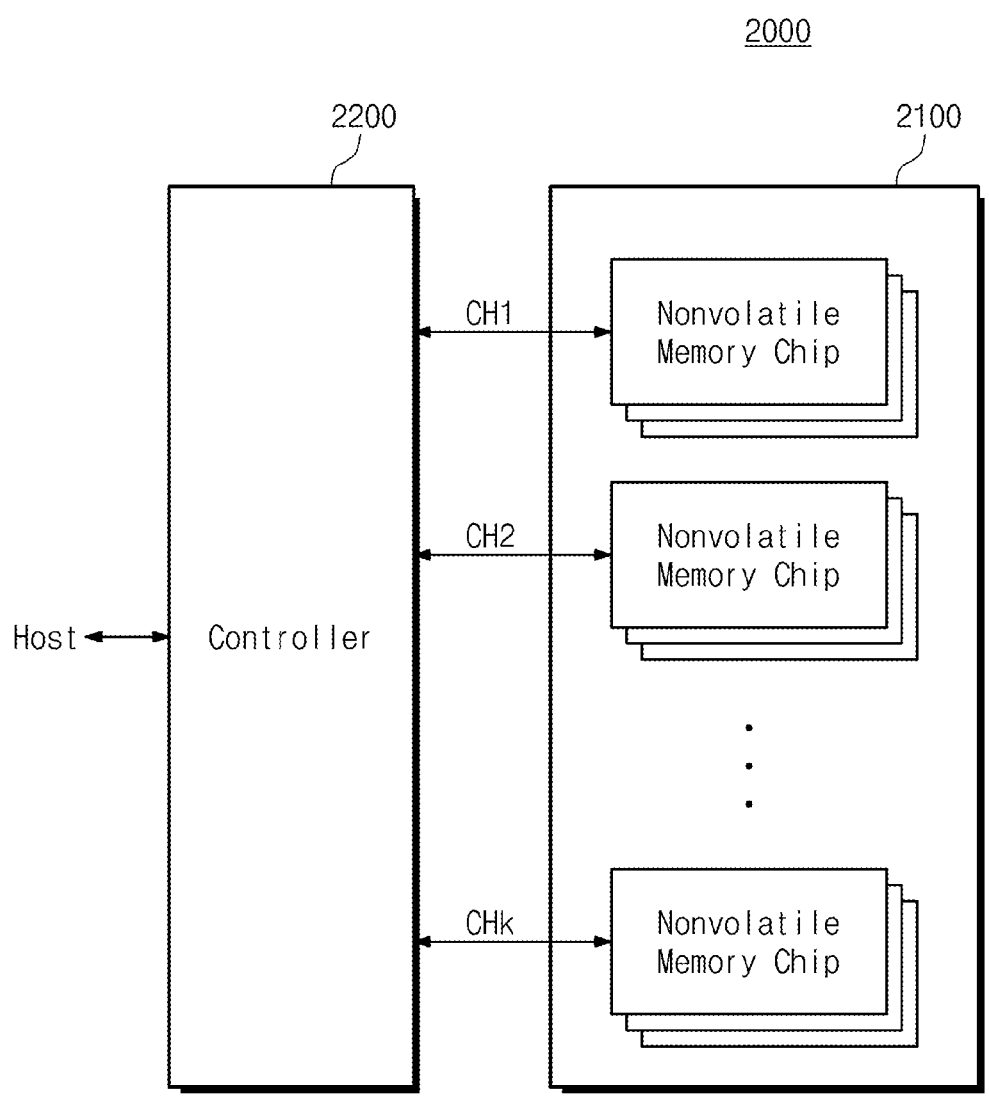
FIG. 21 is a block diagram of a memory system according to an embodiment of the inventive concept.

FIG. 21 is a block diagram of a memory system 2000 according to an embodiment of the inventive concept. This embodiment is a variation of the memory system illustrated in FIG. 20.

Referring to FIG. 21, a memory system 2000 comprises a nonvolatile memory device 2100 and a controller 2200. Nonvolatile memory device 2100 comprises a plurality of nonvolatile memory chips divided into a plurality of groups. Nonvolatile memory chips in each group communicate with controller 2200 via a common channel. In FIG. 21, a plurality of memory chips communicate with controller 2200 via K channels CH1 through CHk. Each of the nonvolatile memory chips can be formed with substantially the same structure and functionality as nonvolatile memory device 100 or nonvolatile memory 1100 of FIG. 19.

As illustrated in FIG. 21, one channel may be connected with a plurality of nonvolatile memory chips. However, memory system 2000 may be modified such that one channel is connected with one nonvolatile memory chip.

Figure 22:
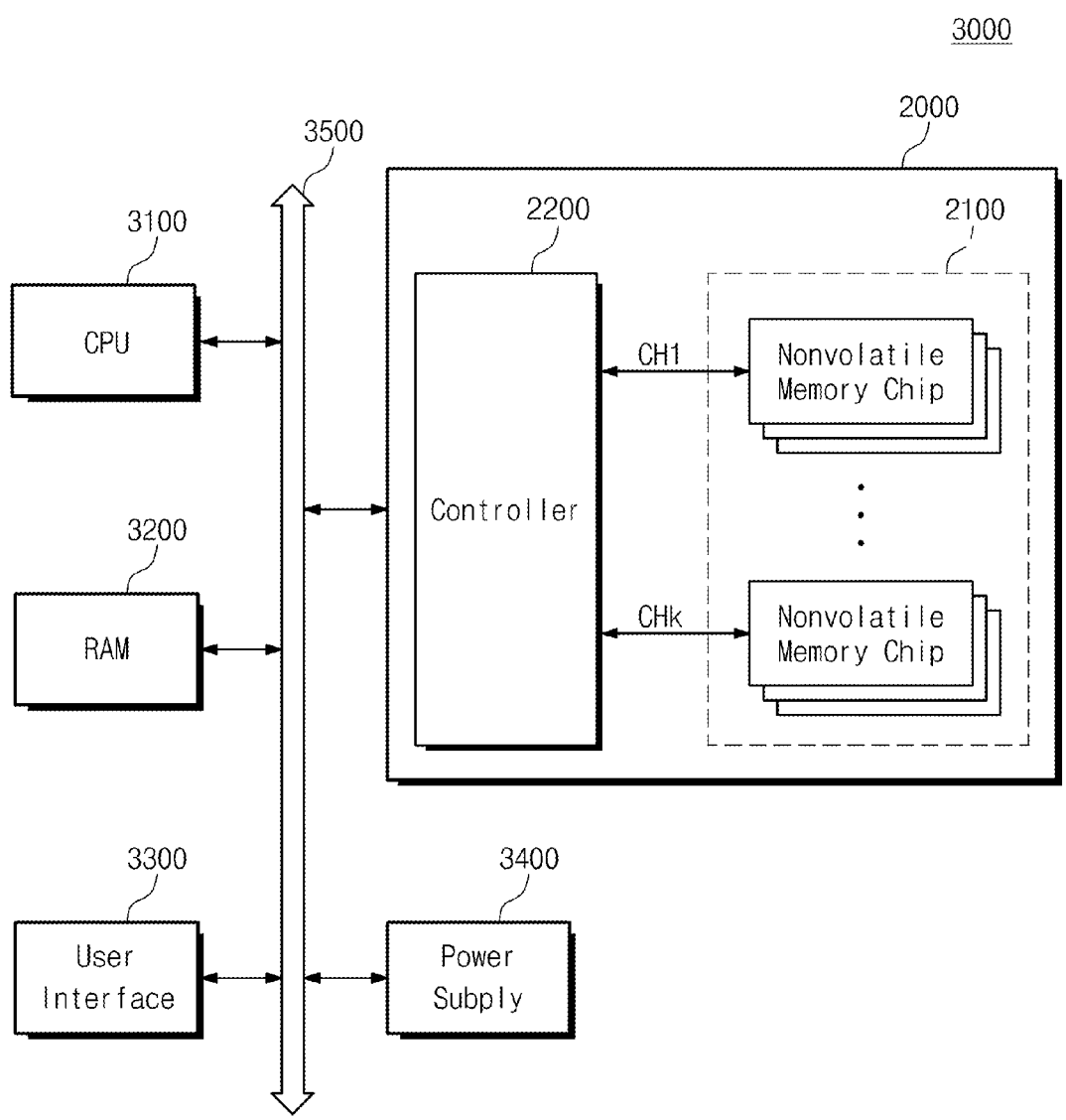
FIG. 22 is a block diagram of a computing system according to an embodiment of the inventive concept.

FIG. 22 is a block diagram of a computing system 3000 comprising memory system 2000 of FIG. 21.

Referring to FIG. 22, computing system 3000 comprises a CPU 3100, a RAM 3200, a user interface 3300, a power supply 3400, and a memory system 2000.

Memory system 2000 is electrically connected with CPU 3100, RAM 3200, user interface 3300, and power supply 3400. Data provided via user interface 3300 or processed by CPU 3100 is stored in memory system 2000. In the embodiment of FIG. 22, nonvolatile memory device 2100 is connected with a system bus 3500 via controller 2200. However, in other embodiments, nonvolatile memory device 2100 can be connected directly with system bus 3500.

As an alternative to incorporating memory system 2000 of FIG. 21, computing system 3000 can incorporate memory system 1000 of FIG. 20. As another alternative, computing system 3000 can incorporate both of memory systems 1000 and 2000 described in FIGS. 20 and 21.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A nonvolatile memory device, comprising:
   a memory cell array comprising a plurality of memory blocks;
   an address decoder configured to select one of the memory blocks in response to an input address and to generate a first control signal and a second control signal;
   a plurality of metal lines connected with the memory blocks and extending along a first direction;
   a plurality of pass transistors configured to connect the address decoder with a first subset of the metal lines connected with the selected memory block in response to the first control signal; and
   a plurality of ground transistors configured to supply a low voltage to a second subset of the metal lines connected with unselected memory blocks in response to the second control signal,
   wherein the ground transistors have channels that extend along a second direction perpendicular to the first direction,
   wherein the pass transistors are configured to connect the address decoder with a plurality of word lines connected with the selected memory block and to float a plurality of word lines connected with unselected memory blocks, in response to the first control signal.

2. The nonvolatile memory device of claim 1, wherein the ground transistors comprise a plurality of ground transistor pairs, and each of the ground transistor pairs comprises:
   a first gate pattern;
   a second gate pattern;
   a first active pattern located at one side of the first gate pattern; a second active pattern located at one side of the second gate pattern; and
   a common active pattern formed between the first gate pattern and the second gate pattern.

3. The nonvolatile memory device of claim 2, wherein the first active pattern is connected with one of the metal lines and the second active pattern is connected with another one of the metal lines.

4. The nonvolatile memory device of claim 2, wherein the common active pattern is connected with a low voltage node via a second metal line.

5. The nonvolatile memory device of claim 2, wherein the common active patterns of the plurality of ground transistor pairs are connected in common with a low voltage node via second metal lines extending along the first direction.

6. The nonvolatile memory device of claim 1, wherein the ground transistors comprise a plurality of ground transistor pairs, and each of the ground transistor pairs comprises:
   first and second gate patterns extending in parallel along the first direction;
   a plurality of first active patterns located at one side of the first gate pattern;
   a plurality of second active patterns provided at one side of the second gate pattern; and
   a plurality of common active patterns formed between the first gate pattern and the second gate pattern.

7. The nonvolatile memory device of claim 6, wherein the plurality of first active patterns, the plurality of second active patterns, and the plurality of common active patterns form a plurality of transistor pairs along the first direction with the first and second gate patterns.

8. The nonvolatile memory device of claim 1, wherein the metal lines pass through a top portion of the ground transistors.

9. The nonvolatile memory device of claim 1, wherein the plurality of metal lines form a plurality of string selection lines connected with the plurality of memory blocks.

10. The nonvolatile memory device of claim 1, wherein the plurality of metal lines form a plurality of ground selection lines connected with the plurality of memory blocks.

11. The nonvolatile memory device of claim 1, wherein the pass transistors are configured to connect the address decoder with metal lines connected with at least two memory blocks of the plurality of memory blocks in response to the first control signal.

12. The nonvolatile memory device of claim 1, wherein the pass transistors and the ground transistors are stacked on a well or substrate.

13. A nonvolatile memory device, comprising:
   a memory cell array comprising a plurality of memory blocks;
   an address decoder configured to select one of the plurality of memory blocks in response to an input address and to generate a first control signal and a second control signal;
   a plurality of first metal lines connected with a plurality of string selection transistors corresponding to the plurality of memory blocks and extending along a first direction;
   a plurality of second metal lines connected with a plurality of memory cell transistors of each of the plurality of memory blocks;
   a plurality of pass transistors configured to connect the address decoder with a subset of the first and second metal lines corresponding to the selected memory block in response to the first control signal; and
   a plurality of ground transistors configured to connect a low voltage node with a subset of the first metal lines connected to unselected memory blocks,
   wherein the ground transistors have channels that extend along a second direction perpendicular to the first direction,
   wherein the pass transistors are configured to connect the address decoder with a plurality of word lines connected with the selected memory block and to float a plurality of word lines connected with unselected memory blocks, in response to the first control signal.

14. The nonvolatile memory device of claim 13, further comprising:
   a plurality of third metal lines connected with a plurality of ground selection transistors of the plurality of memory blocks,
   wherein the ground transistors are further configured to connect the low voltage node with the plurality of third metal lines in response to the second control signal.

15. The nonvolatile memory device of claim 13, wherein the ground transistors comprise a plurality of ground transistor pairs each comprising:
   a first gate pattern;
   a second gate pattern;
   a first active pattern located at one side of the first gate pattern;
   a second active pattern located at one side of the second gate pattern; and
   a common active pattern formed between the first gate pattern and the second gate pattern.

16. A nonvolatile memory device, comprising:
   a memory cell array comprising a plurality of memory blocks;
   a plurality of metal lines connected with the memory blocks and extending along a first direction;
   a plurality of pass transistors configured to supply a first voltage to a first subset of the metal lines connected with a selected memory block in response to a first control signal; and
   a plurality of ground transistors configured to supply a second voltage to a second subset of the metal lines connected with unselected memory blocks in response to a second control signal,
   wherein the ground transistors have channels that extend along a second direction perpendicular to the first direction,
   wherein the pass transistors are configured to connect an address decoder with a plurality of word lines connected with the selected memory block and to float a plurality of word lines connected with unselected memory blocks, in response to the first control signal.

17. The nonvolatile memory device of claim 16, wherein the second voltage is a ground voltage.

18. The nonvolatile memory device of claim 16, wherein the memory cell array comprises a plurality of cell strings comprising a plurality of memory cell transistors stacked in the second direction on a substrate.

19. The nonvolatile memory device of claim 18, wherein the cell strings are formed adjacent to a plurality of pillars extending in the second direction from a plane extending in the first direction and in a third direction perpendicular to the second direction.

* * * * *